US012575280B2

(12) United States Patent
You

(10) Patent No.: US 12,575,280 B2
(45) Date of Patent: Mar. 10, 2026

(54) DISPLAY APPARATUS INCLUDING PAD ELECTRODE CONNECTED TO FAN-OUT WIRING, AND METHOD OF MANUFACTURING THE SAME

(71) Applicant: Samsung Display Co., Ltd., Yongin-si (KR)

(72) Inventor: Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 577 days.

(21) Appl. No.: 17/901,587

(22) Filed: Sep. 1, 2022

(65) Prior Publication Data

US 2023/0172022 A1     Jun. 1, 2023

(30) Foreign Application Priority Data

Nov. 26, 2021     (KR) ......................... 10-2021-0166099

(51) Int. Cl.
*H10K 59/131*          (2023.01)
*H10K 59/12*           (2023.01)
*H10K 71/00*           (2023.01)

(52) U.S. Cl.
CPC ......... *H10K 59/1315* (2023.02); *H10K 71/00* (2023.02); *H10K 59/1201* (2023.02)

(58) Field of Classification Search
CPC ............... H10K 59/1315; H10K 71/00; H10K 59/1201; H10K 59/1213; H10K 59/131; H10K 50/844; H10K 59/121; H10K 59/18; H10K 77/111; H10K 2102/311; H10D 86/441; H10D 86/451; H10D 86/60; H10H 29/142; H10H 20/01; H10H 20/857; G06F 3/1446; G09G 2380/02; G09G 3/3208; G09G 3/32; G09G 2300/026; G09F 9/301;
(Continued)

(56) References Cited

U.S. PATENT DOCUMENTS 5,970,327  A     10/1999  Makita et al.
7,838,880  B2    11/2010  Kwak et al.
(Continued)

FOREIGN PATENT DOCUMENTS

KR          10-0437296  B1     11/2004
KR     10-2007-0036996  A      4/2007
(Continued)

*Primary Examiner* — Caleb E Henry
(74) *Attorney, Agent, or Firm* — Womble Bond Dickinson (US) LLP

(57) ABSTRACT

A display apparatus includes: a first substrate including a display area, and a pad area outside the display area; a lower conductive layer on the first substrate, and including a fan-out wiring extending from the pad area to the display area; a first inorganic insulating layer on the lower conductive layer; a semiconductor layer on the first inorganic insulating layer, and overlapping with the display area; a second inorganic insulating layer covering the semiconductor layer, and overlapping with the display area and the pad area; a pad electrode on the second inorganic insulating layer, the pad electrode overlapping with the pad area, and electrically connected to the fan-out wiring; and a display element layer on the second inorganic insulating layer, and including a display element overlapping with the display area.

15 Claims, 24 Drawing Sheets

(58) Field of Classification Search
CPC ..... G09F 9/33; H01L 27/156; H01L 27/1214;
H01L 27/3293
See application file for complete search history.

(56) References Cited

U.S. PATENT DOCUMENTS

| | | | | |
|---|---|---|---|---|
| 8,729,552 | B2 | 5/2014 | Kim et al. | |
| 9,309,405 | B2 | 4/2016 | Park et al. | |
| 9,792,867 | B2* | 10/2017 | Ohishi | G02F 1/1345 |
| 10,361,223 | B2* | 7/2019 | Kim | H10D 89/911 |
| 10,503,297 | B2* | 12/2019 | Zeng | H04M 1/0266 |
| 10,575,403 | B2* | 2/2020 | Park | G02F 1/1333 |
| 10,658,628 | B2* | 5/2020 | Lee | H10K 59/873 |
| 10,777,766 | B2 | 9/2020 | Im et al. | |
| 10,896,946 | B2* | 1/2021 | Na | H10D 86/60 |
| 11,355,568 | B2* | 6/2022 | Ka | H10D 86/60 |
| 11,404,521 | B2* | 8/2022 | Moon | H10K 59/131 |
| 11,594,692 | B2* | 2/2023 | Choi | H10K 50/844 |
| 2007/0291042 | A1* | 12/2007 | Kwak | G09G 3/3688 |
| | | | | 345/535 |
| 2007/0296659 | A1* | 12/2007 | Kwak | G02F 1/13452 |
| | | | | 349/56 |
| 2013/0001566 | A1 | 1/2013 | Jeong et al. | |
| 2013/0228867 | A1* | 9/2013 | Suematsu | H01L 23/60 |
| | | | | 257/355 |
| 2014/0117998 | A1* | 5/2014 | Hwang | G09G 3/006 |
| | | | | 324/511 |
| 2014/0217373 | A1* | 8/2014 | Youn | H10K 50/805 |
| | | | | 438/23 |
| 2014/0217382 | A1* | 8/2014 | Kwon | H10K 50/8426 |
| | | | | 257/40 |
| 2014/0353670 | A1* | 12/2014 | Youn | H10D 86/60 |
| | | | | 438/586 |
| 2014/0376135 | A1* | 12/2014 | Huo | H10D 89/711 |
| | | | | 361/56 |
| 2015/0036300 | A1* | 2/2015 | Park | H05K 1/147 |
| | | | | 156/212 |
| 2015/0103500 | A1* | 4/2015 | Bae | H05K 1/111 |
| | | | | 228/102 |
| 2015/0270287 | A1* | 9/2015 | Kim | H10D 86/441 |
| | | | | 257/40 |
| 2015/0380679 | A1* | 12/2015 | Fujiyoshi | H10K 77/111 |
| | | | | 438/26 |
| 2016/0044751 | A1* | 2/2016 | Ikeda | H05B 33/02 |
| | | | | 362/227 |
| 2016/0172428 | A1* | 6/2016 | Song | H10K 59/131 |
| | | | | 257/40 |
| 2016/0174304 | A1* | 6/2016 | Kim | H10K 59/8792 |
| 2017/0025637 | A1* | 1/2017 | Kim | H10K 59/1213 |
| 2017/0069616 | A1* | 3/2017 | Cai | H10D 84/135 |
| 2017/0104089 | A1 | 4/2017 | Koezuka et al. | |
| 2017/0179112 | A1* | 6/2017 | Narita | H01L 23/5221 |
| 2018/0061917 | A1* | 3/2018 | Kim | H10K 59/8722 |
| 2018/0090702 | A1* | 3/2018 | Um | H10K 50/844 |
| 2018/0301520 | A1* | 10/2018 | Jin | H10K 59/1315 |
| 2019/0179591 | A1* | 6/2019 | Kuo | H10K 59/18 |
| 2019/0206979 | A1 | 7/2019 | Han et al. | |
| 2019/0281699 | A1* | 9/2019 | Bae | H05K 1/111 |
| 2019/0346953 | A1* | 11/2019 | Peng | G09G 3/20 |
| 2020/0067017 | A1* | 2/2020 | Seo | H10K 77/10 |
| 2020/0312236 | A1* | 10/2020 | Ma | G09G 3/3225 |
| 2021/0020872 | A1 | 1/2021 | Park et al. | |
| 2021/0091163 | A1 | 3/2021 | Son et al. | |
| 2021/0134910 | A1* | 5/2021 | Yang | H10D 86/60 |
| 2021/0225977 | A1 | 7/2021 | Kwon | |
| 2021/0366936 | A1 | 11/2021 | Yang et al. | |
| 2022/0045301 | A1* | 2/2022 | Jang | H10K 59/124 |

FOREIGN PATENT DOCUMENTS

| | | | |
|---|---|---|---|
| KR | 10-1732178 | B1 | 7/2011 |
| KR | 10-2013-0007048 | A | 1/2013 |
| KR | 10-2013-0007163 | A | 1/2013 |
| KR | 10-2016-0007407 | A | 1/2016 |
| KR | 10-2225253 | B1 | 3/2016 |
| KR | 10-2017-0115640 | A | 10/2017 |

* cited by examiner

FIG. 5

DISPLAY APPARATUS INCLUDING PAD ELECTRODE CONNECTED TO FAN-OUT WIRING, AND METHOD OF MANUFACTURING THE SAME

CROSS-REFERENCE TO RELATED APPLICATION

This application claims priority to and the benefit of Korean Patent Application No. 10-2021-0166099, filed on Nov. 26, 2021, in the Korean Intellectual Property Office, the entire disclosure of which is incorporated by reference herein.

BACKGROUND

1. Field

Aspects of one or more embodiments of the present disclosure relate to a display apparatus, and a method of manufacturing the same.

2. Description of the Related Art

Display apparatuses visually display data. A display apparatus is used as a display for a small electronic product, for example, such as a mobile phone, or is used as a display for a large electronic product, for example, such as a television. Also, a display apparatus may be used as a display for other electronic products, for example, such as a tablet PC or a laptop computer.

A display apparatus may include a plurality of sub-pixels that receive an electrical signal to emit light in order to display an image to the outside. Each of the plurality of sub-pixels may include a display element. Recently, there may be increasing demand for a display apparatus that uses a wiring having low resistance and high reliability.

The above information disclosed in this Background section is for enhancement of understanding of the background of the present disclosure, and therefore, it may contain information that does not constitute prior art.

SUMMARY

One or more embodiments of the present disclosure are directed to a display apparatus including a wiring having low resistance and high reliability, and a method of manufacturing the display apparatus.

However, the present disclosure is not limited to the aspects and features set forth above, and additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a first substrate including a display area, and a pad area outside the display area; a lower conductive layer located on the first substrate, and including a fan-out wiring extending from the pad area to the display area; a first inorganic insulating layer located on the lower conductive layer; a semiconductor layer located on the first inorganic insulating layer, and overlapping with the display area; a second inorganic insulating layer covering the semiconductor layer, and overlapping with the display area and the pad area; a pad electrode on the second inorganic insulating layer, the pad electrode overlapping with the pad area, and electrically connected to the fan-out wiring; and a display element layer located on the second inorganic insulating layer, and including a display element overlapping with the display area.

In an embodiment, the pad electrode may be electrically connected to the fan-out wiring through a first pad hole of the first inorganic insulating layer and a second pad hole of the second inorganic insulating layer.

In an embodiment, the lower conductive layer may include: a first layer including a first metal; and a second layer located on the first layer, and including a second metal different from the first metal.

In an embodiment, the first metal may include aluminum, and the second metal may include titanium.

In an embodiment, the first layer may include aluminum and an aluminum oxide, and the second layer may include titanium.

In an embodiment, the lower conductive layer may include: a first layer including a first metal; and a second layer located on the first layer, and including an inorganic material.

In an embodiment, the display apparatus may further include a planarization layer located between the lower conductive layer and the first inorganic insulating layer.

In an embodiment, the display apparatus may further include: a first conductive layer located on the second inorganic insulating layer, and including a gate electrode overlapping with the semiconductor layer; a third inorganic insulating layer covering the gate electrode; and a second conductive layer located between the third inorganic insulating layer and the display element layer, and including a source electrode and a drain electrode. The lower conductive layer may further include a first lower connection wiring overlapping with the display area, and one of the source electrode and the drain electrode may be electrically connected to the first lower connection wiring through a first insulating layer hole of the first inorganic insulating layer, a semiconductor layer hole of the semiconductor layer, a second insulating layer hole of the second inorganic insulating layer, and a third insulating layer hole of the third inorganic insulating layer.

In an embodiment, the display apparatus may further include: a third inorganic insulating layer located on the second inorganic insulating layer; and a first connection wiring located on the third inorganic insulating layer. The lower conductive layer may further include a second lower connection wiring, and the first connection wiring may be electrically connected to the second lower connection wiring through a hole of the first inorganic insulating layer, a hole of the second inorganic insulating layer, and a hole of the third inorganic insulating layer.

In an embodiment, the display apparatus may further include: a second connection wiring located on the second inorganic insulating layer; a third inorganic insulating layer located on the second connection wiring; and a connection electrode located on the third inorganic insulating layer. The lower conductive layer may further include a third lower connection wiring, the connection electrode may be electrically connected to the third lower connection wiring through a hole of the first inorganic insulating layer, a hole of the second inorganic insulating layer, and a first hole of the third inorganic insulating layer, and the second connection wiring may be electrically connected to the connection electrode through a second hole of the third inorganic insulating layer.

In an embodiment, the display apparatus may further include: a first conductive layer located on the second inorganic insulating layer, and including a gate electrode overlapping with the semiconductor layer; a third inorganic insulating layer covering the gate electrode; a second conductive layer located between the third inorganic insulating layer and the display element layer, and including a source electrode and a drain electrode; and an organic insulating layer located between the second conductive layer and the display element layer. The display element may include a pixel electrode directly connected to one of the source electrode and the drain electrode through a contact hole of the organic insulating layer.

In an embodiment, the second conductive layer may include aluminum.

In an embodiment, the display apparatus may further include a fourth inorganic insulating layer covering at least a part of the pad electrode, and including an upper pad hole overlapping with the pad electrode.

In an embodiment, the display apparatus may further include: a second substrate located on the display element layer; and a sealing member located between the first substrate and the second substrate, and surrounding around a periphery of the display area. The sealing member may at least partially overlap with the lower conductive layer in a plan view.

In an embodiment, the first substrate may include glass.

According to one or more embodiments of the present disclosure, a method of manufacturing a display apparatus, includes: forming a lower conductive layer on a first substrate; sequentially forming a first inorganic insulating layer, a semiconductor layer, a second inorganic insulating layer, a first conductive layer, and a third inorganic insulating layer on the lower conductive layer; forming a first insulating layer hole in the first inorganic insulating layer, a semiconductor layer hole in the semiconductor layer, a second insulating layer hole in the second inorganic insulating layer, and a third insulating layer hole in the third inorganic insulating layer; and forming a second conductive layer on the third inorganic insulating layer, and electrically connected to the lower conductive layer through the first insulating layer hole, the semiconductor layer hole, the second insulating layer hole, and the third insulating layer hole.

In an embodiment, the forming of the lower conductive layer may include: forming a first layer including a first metal; forming a second layer on the first layer, the second layer including at least one inorganic material or a second metal that is different from the first metal; and etching the first layer and the second layer.

In an embodiment, the forming of the first layer may include oxidizing the first layer.

In an embodiment, the forming of the lower conductive layer may further include heat-treating the first layer and the second layer before the etching of the first layer and the second layer.

In an embodiment, the method may further include forming a fourth inorganic insulating layer on the second conductive layer. The first substrate may include a display area, and a pad area located outside the display area; the second conductive layer may include a pad electrode overlapping with the pad area; and the fourth inorganic insulating layer may cover at least a part of the pad electrode, and may include an upper pad hole overlapping with the pad electrode.

BRIEF DESCRIPTION OF THE DRAWINGS

The above and other aspects and features of the present disclosure will be more clearly understood from the follow-

Figure 1:
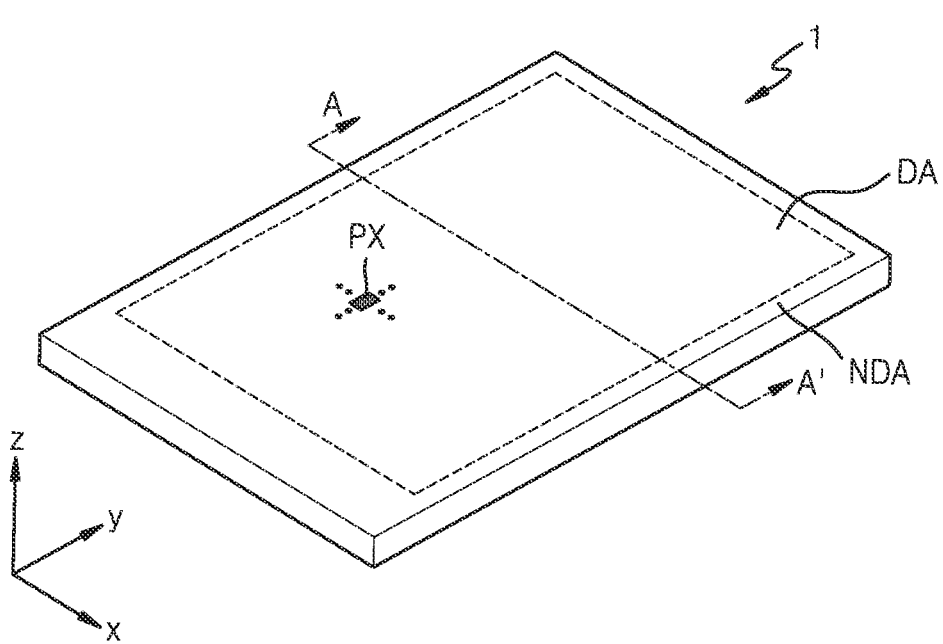
Figure 2:
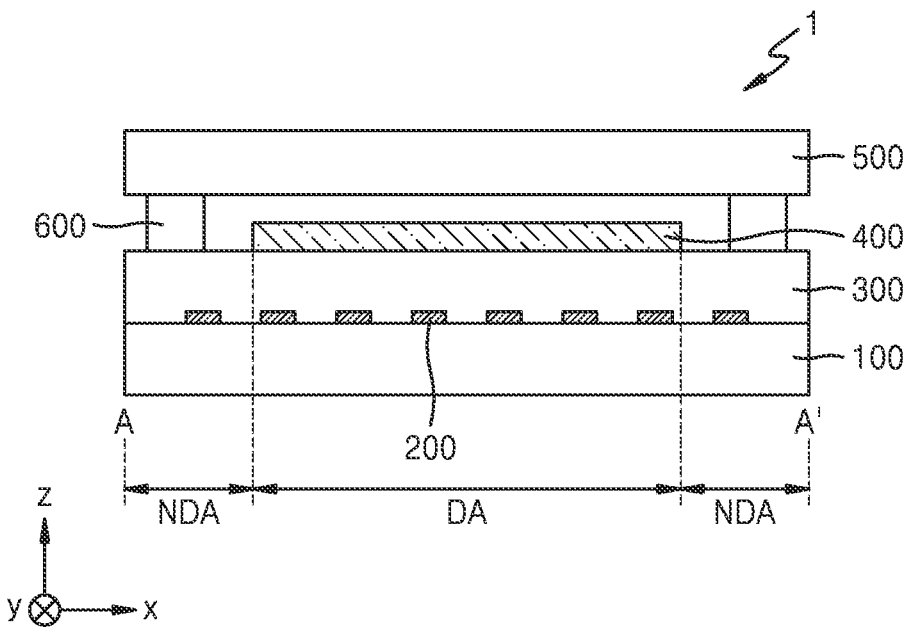
Figure 3:
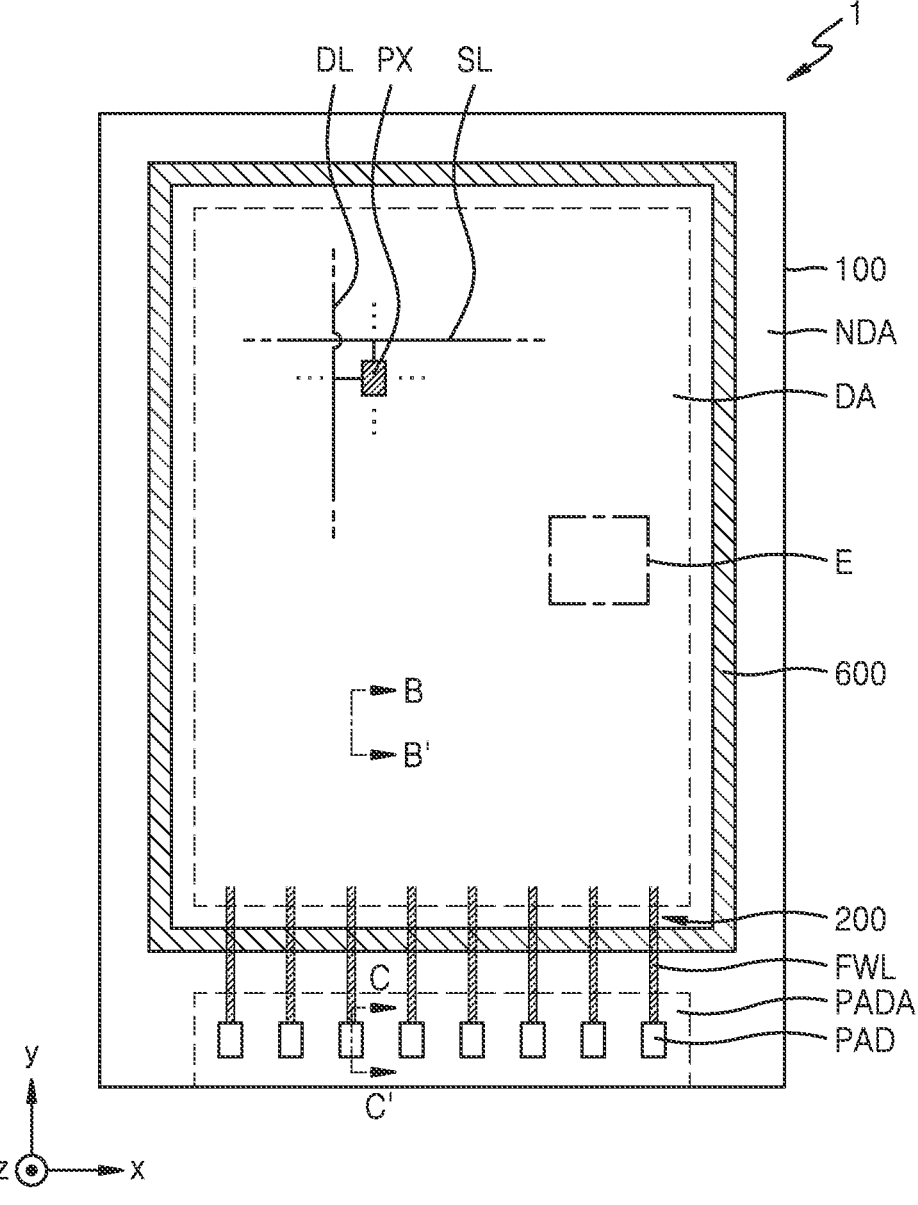
Figure 4:
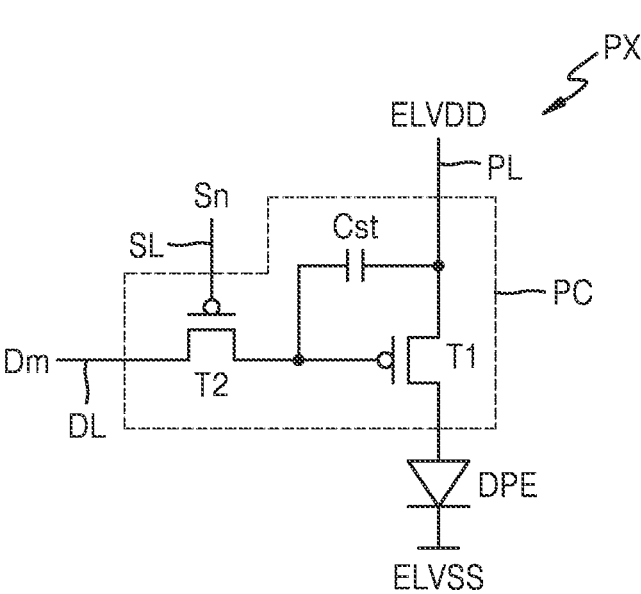
Figure 6A:
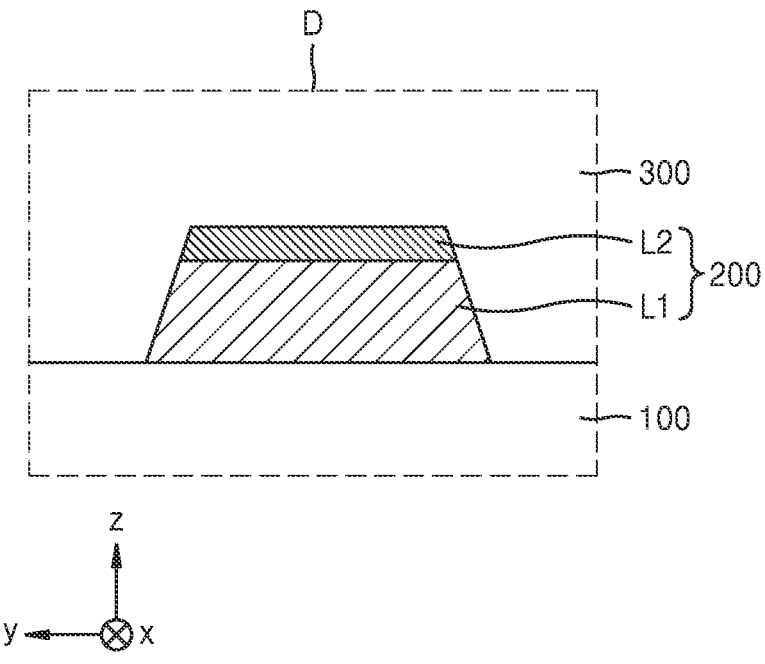
Figure 6B:
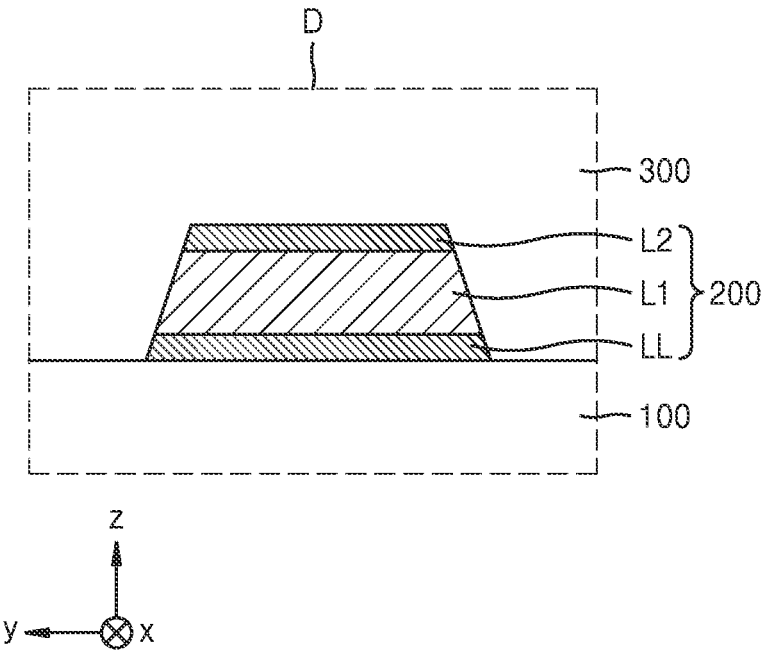
Figure 7A:
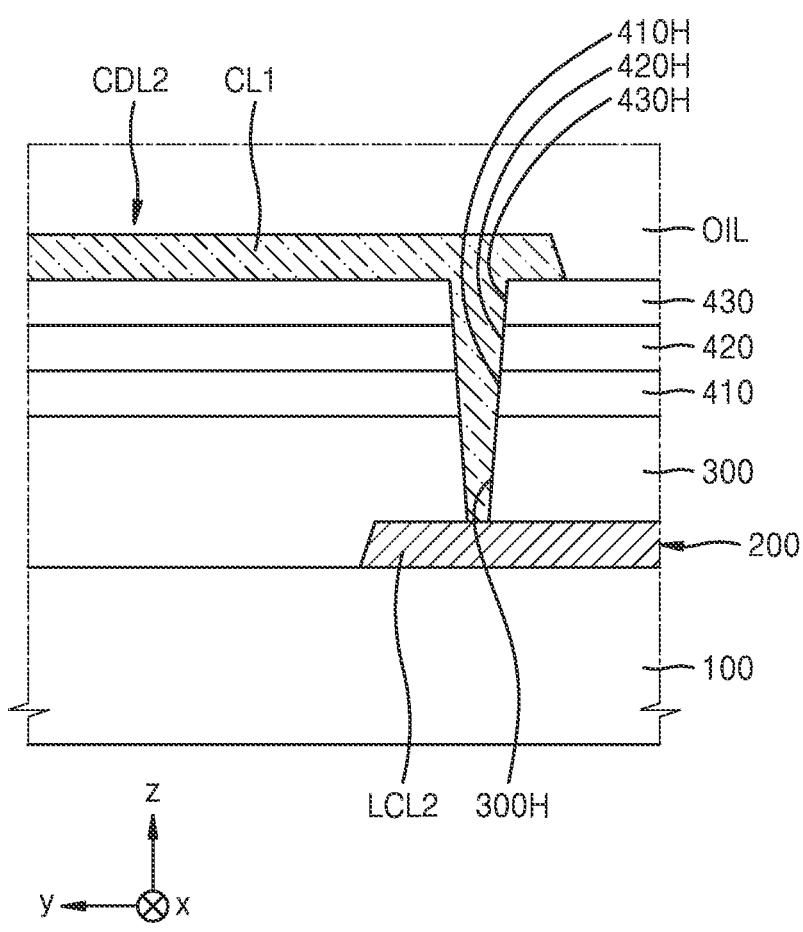
Figure 7B:
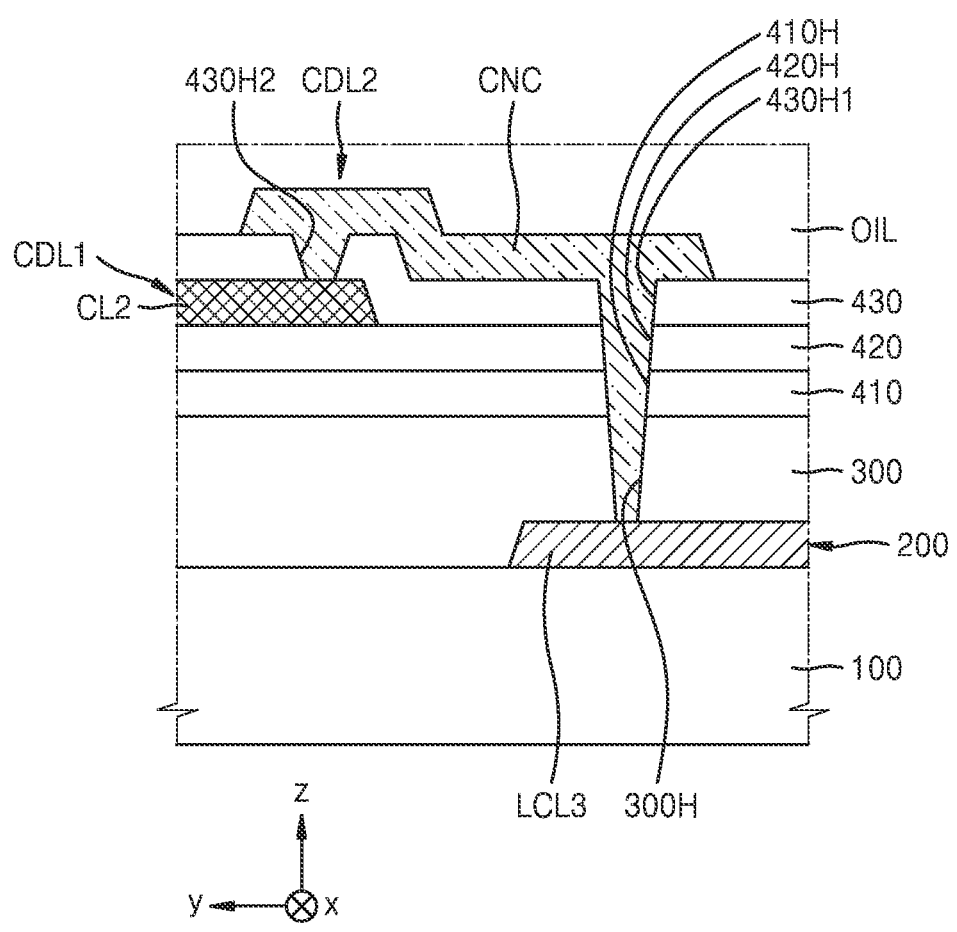
Figure 8:
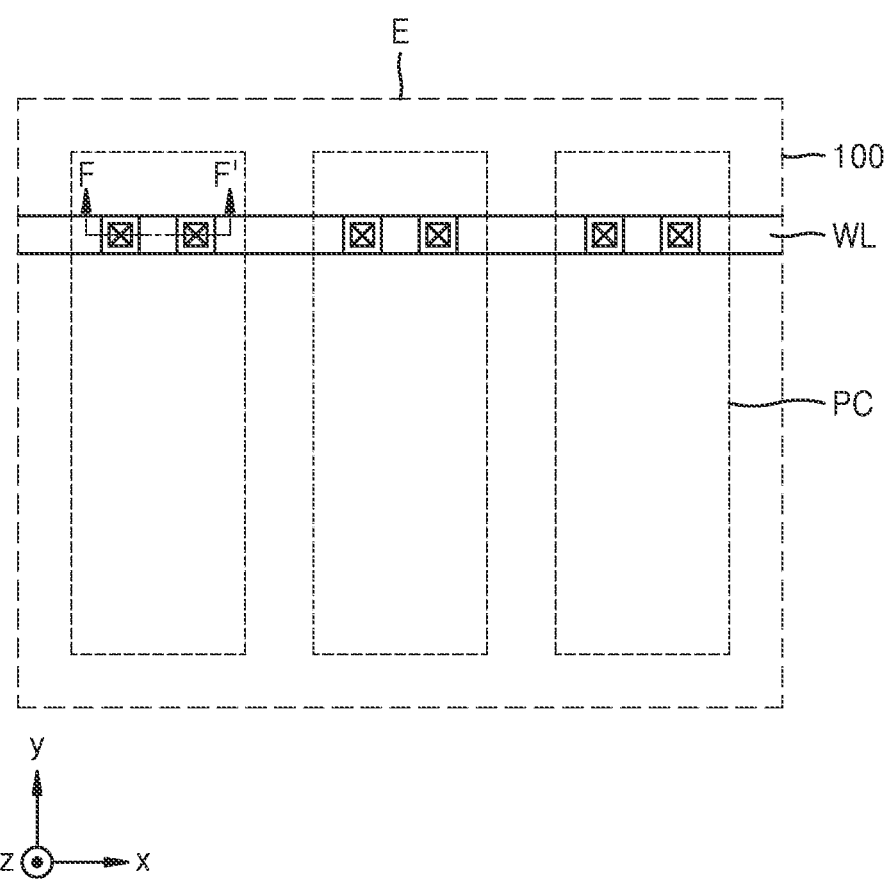
Figure 9A:
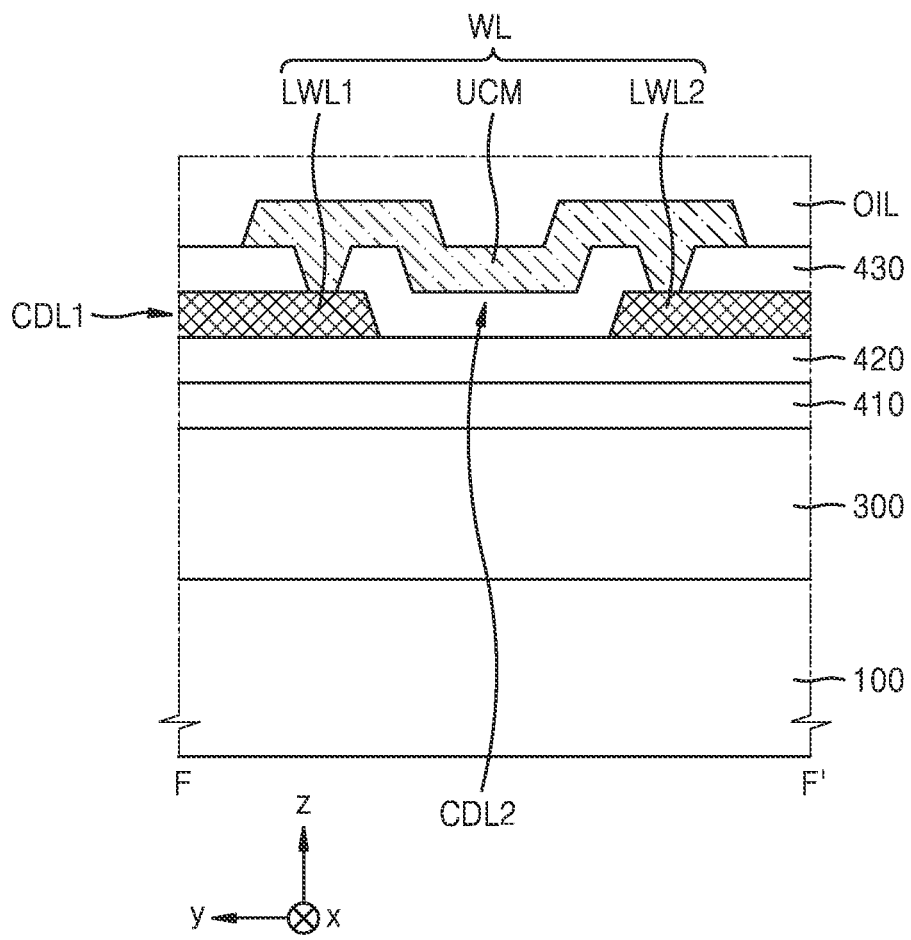
Figure 9B:
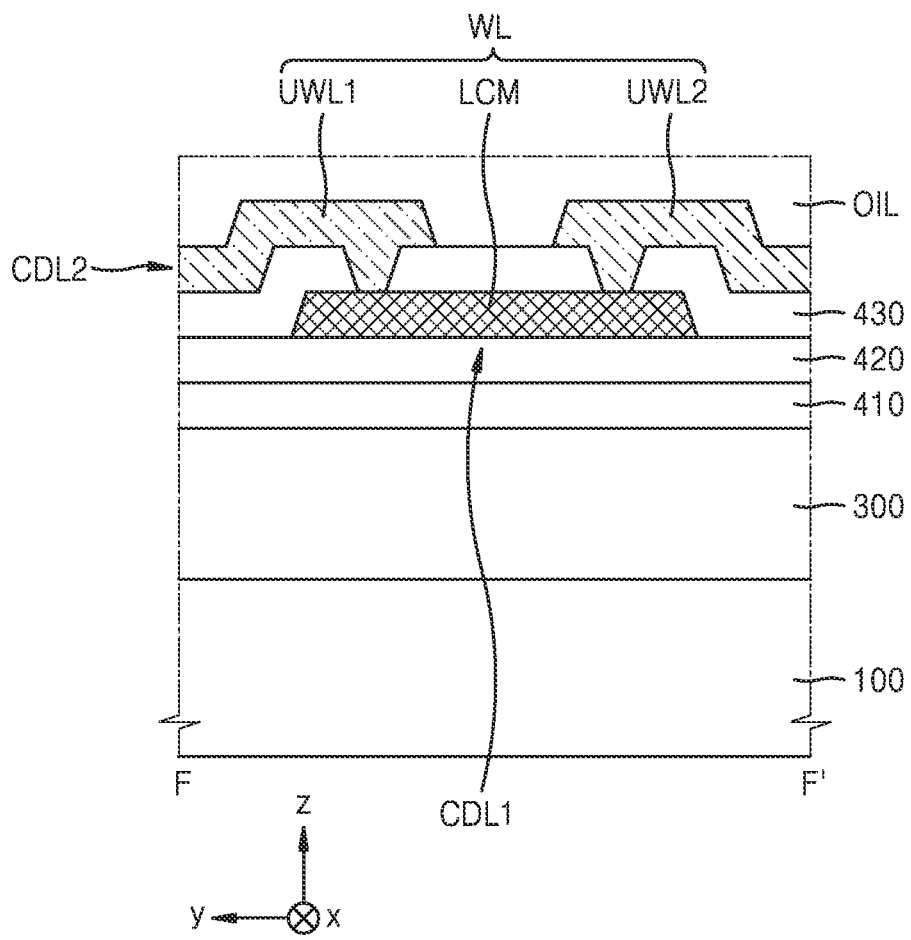
Figure 11A:
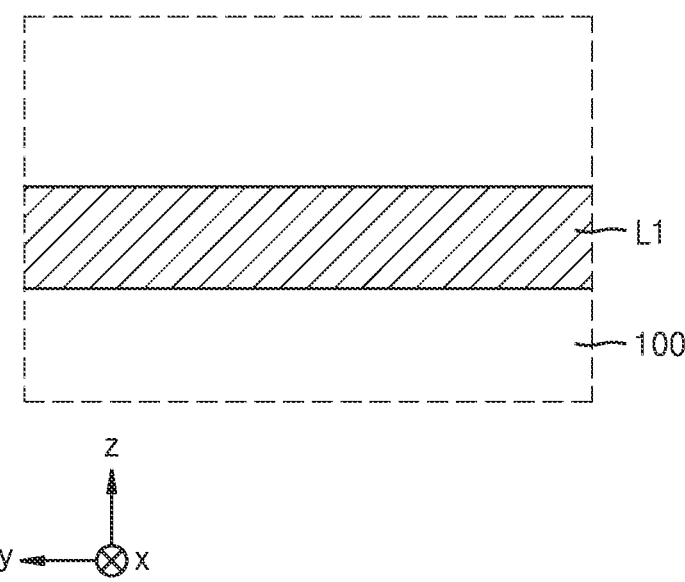
Figure 11B:
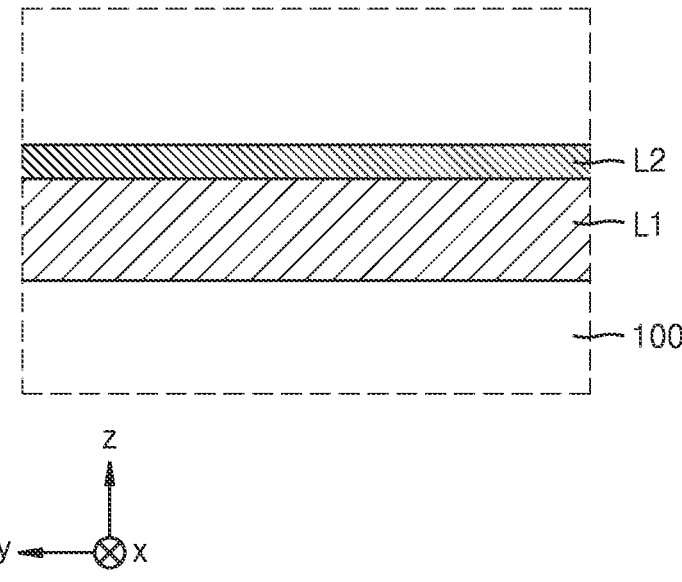
Figure 11C:
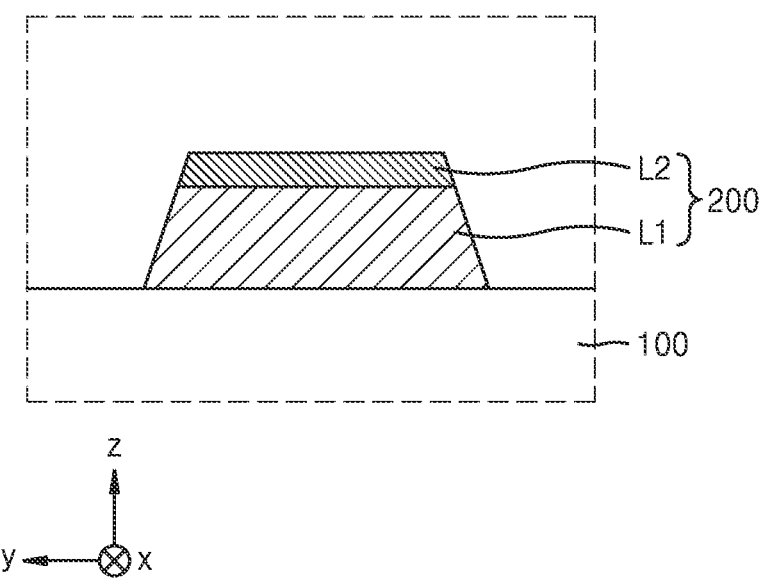
Figure 12:
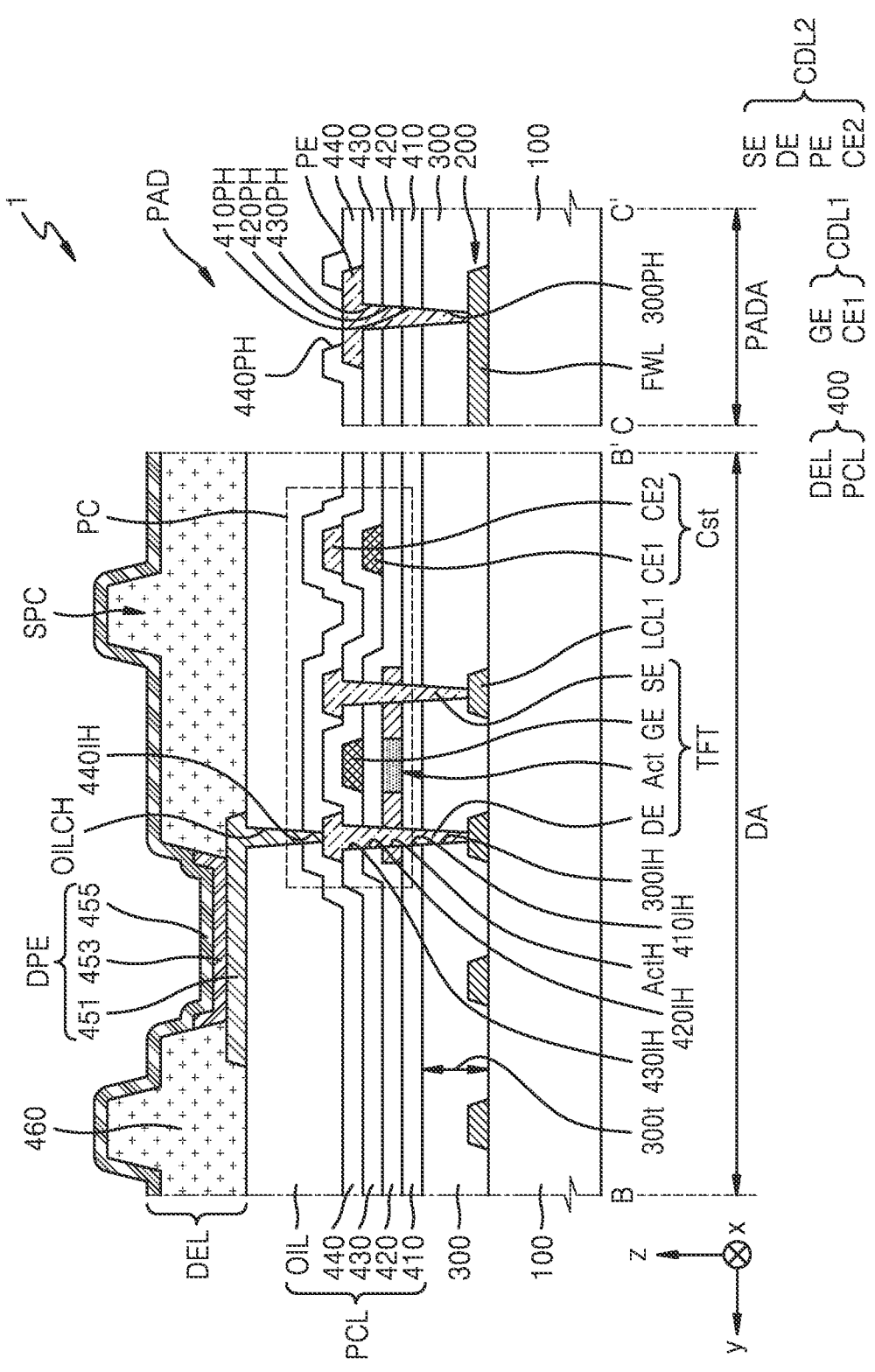
Figure 13A:
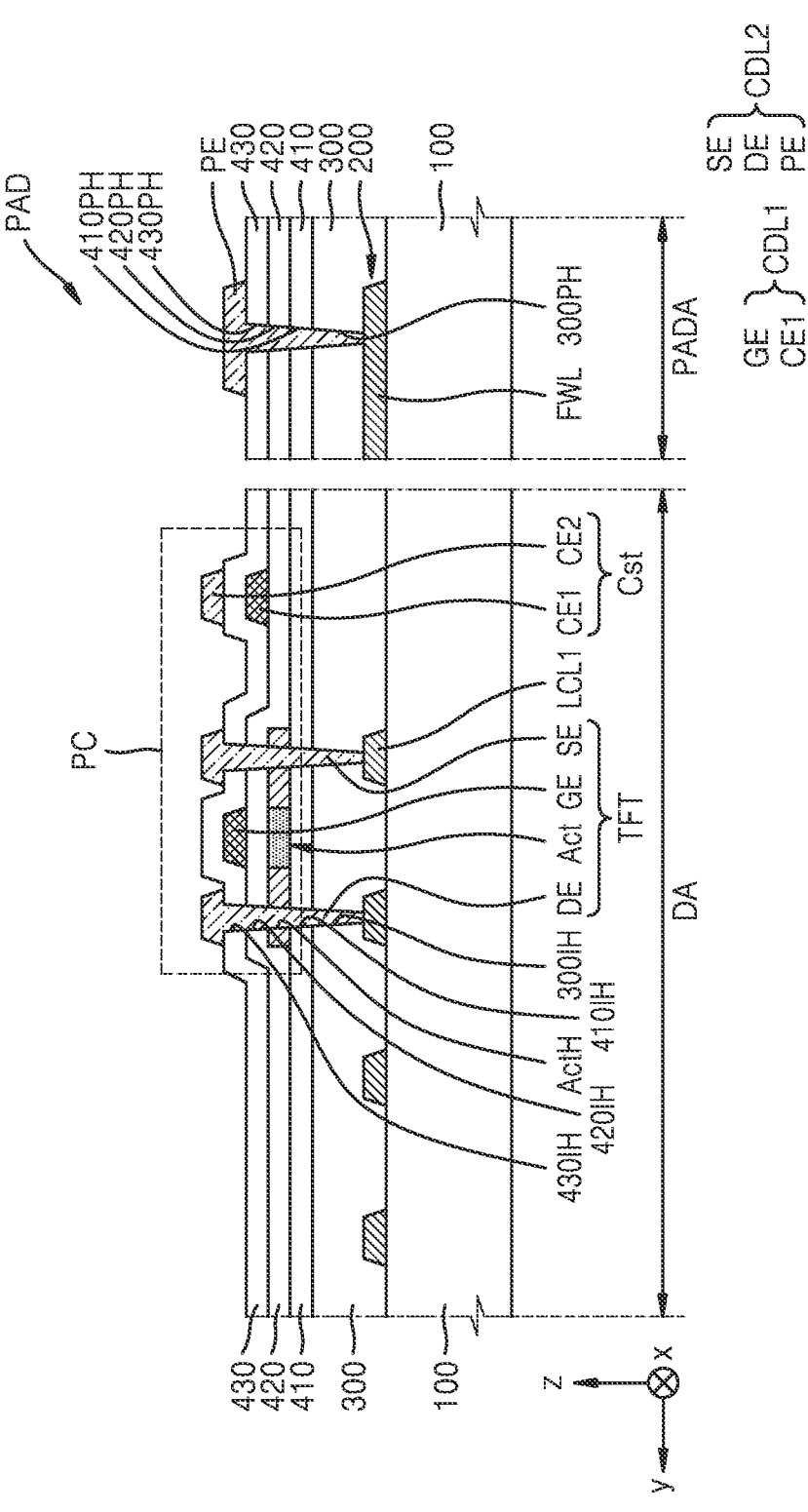
Figure 13B:
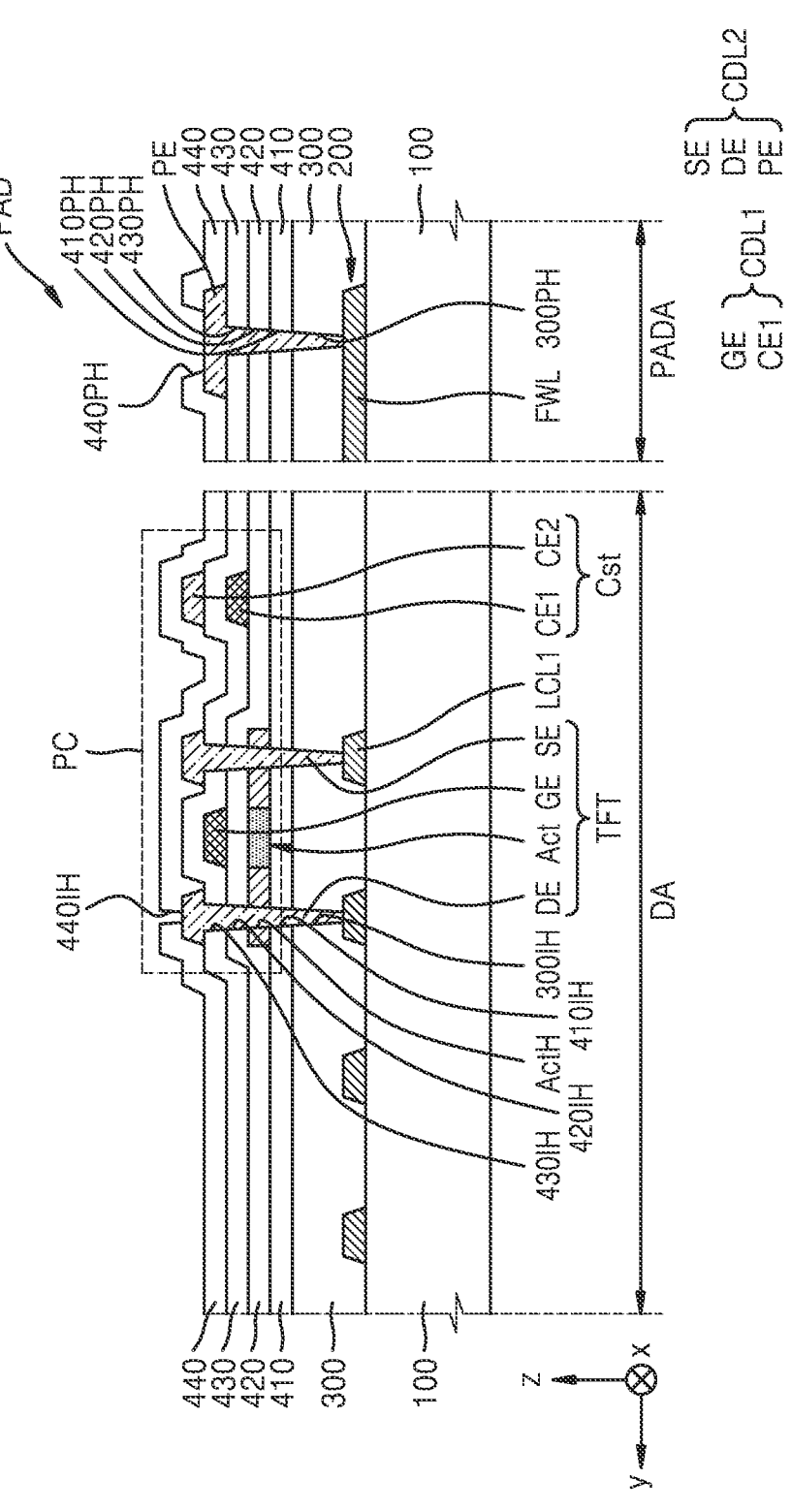

4 ing detailed description of the illustrative, non-limiting embodiments with reference to the accompanying drawings, in which:

FIG. 1 is a perspective view illustrating a display apparatus, according to an embodiment;

FIG. 2 is a cross-sectional view illustrating the display apparatus taken along the line A-A' of FIG. 1;

FIG. 3 is a plan view illustrating the display apparatus of FIG. 1;

FIG. 4 is an equivalent circuit diagram illustrating a pixel of the display apparatus, according to an embodiment;

Figure 5:
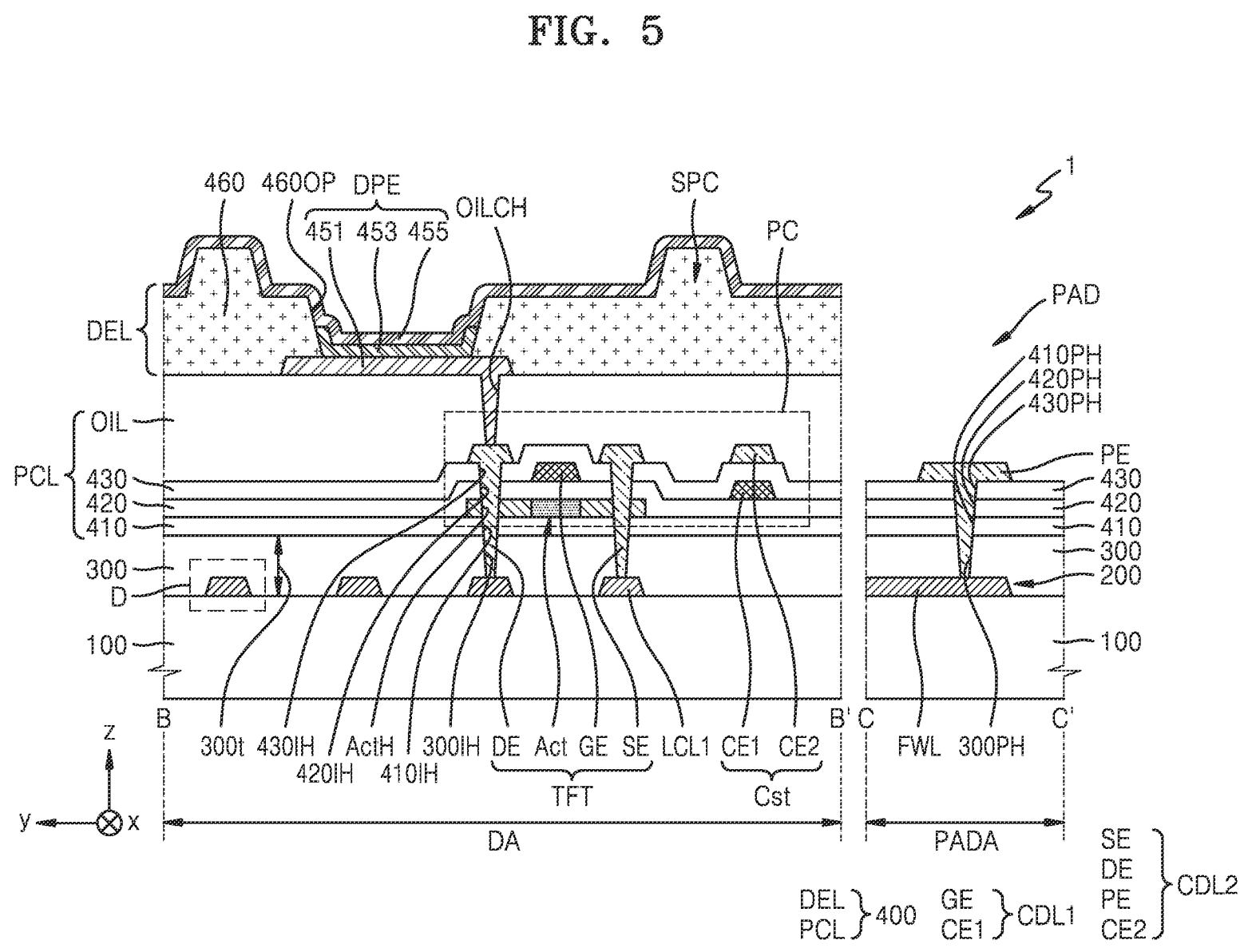

FIG. 5 is a cross-sectional view illustrating the display apparatus taken along the lines B-B' and C-C' of FIG. 3, according to an embodiment;

FIGS. 6A-6B are enlarged views illustrating the portion D of the display apparatus of FIG. 5, according to various embodiments;

FIG. 7A is a cross-sectional view illustrating a state in which a lower conductive layer and a second conductive layer are connected to each other;

FIG. 7B is a cross-sectional view illustrating a state in which a lower conductive layer and a first conductive layer are connected to each other;

FIG. 8 is an enlarged view illustrating the portion E of the display apparatus of FIG. 3, according to an embodiment;

FIGS. 9A-9B are cross-sectional views illustrating the display apparatus taken along the line F-F' of FIG. 8, according to various embodiments;

FIGS. 10A-10F are cross-sectional views illustrating manufacturing processes of a display apparatus, according to an embodiment;

FIGS. 11A-11C are cross-sectional views illustrating manufacturing processes of a lower conductive layer, according to an embodiment;

FIG. 12 is a cross-sectional view illustrating the display apparatus taken along the lines B-B' and C-C' of FIG. 3, according to another embodiment; and FIGS. 13A-13B are cross-sectional views illustrating manufacturing processes of a display apparatus, according to another embodiment.

DETAILED DESCRIPTION

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display apparatus 1 according to an embodiment.

Referring to FIG. 1, the display apparatus 1 may display an image. The display apparatus 1 may include a display area DA and a non-display area NDA. A pixel PX may be located at (e.g., in or on) the display area DA. The non-display area NDA may at least partially surround (e.g., around a periphery of) the display area DA. The pixel PX may not be located at (e.g., in or on) the non-display area NDA. A pad may be located at (e.g., in or on) the non-display area NDA.

Although the display area DA of the display apparatus 1 is shown in FIG. 1 as having a quadrangular shape, in other embodiments, the display area DA may have a circular shape, an elliptical shape, or another suitable polygonal shape, for example, such as a triangular shape or a pentagonal shape. Also, although the display apparatus 1 is shown in FIG. 1 as being a flat panel display apparatus, the present disclosure is not limited thereto, and the display apparatus 1 may be implemented as any one of various suitable apparatuses, for example, such as a flexible, foldable, and/or rollable display apparatus.

A plurality of pixels PX may be located at (e.g., in or on) the display area DA. The plurality of pixels PX may emit light, and the display apparatus 1 may display an image from the display area DA. In an embodiment, the pixel PX may include a plurality of sub-pixels. In an embodiment, any one of the plurality of sub-pixels may emit red light, green light, or blue light. In another embodiment, any one of the plurality of sub-pixels may emit red light, green light, blue light, or white light.

FIG. 2 is a cross-sectional view illustrating the display apparatus 1 taken along the line A-A' of FIG. 1. In FIG. 2, the same or substantially the same elements as those illustrated in FIG. 1 are denoted by the same reference numerals, and thus, redundant description thereof may not be repeated.

Referring to FIG. 2, the display apparatus 1 may include a first substrate 100, a lower conductive layer 200, a planarization layer 300, a display layer 400, a second substrate 500, and a sealing member 600. The display area DA and the non-display area NDA may be defined at (e.g., in or on) the first substrate 100. In other words, the first substrate 100 may include the display area DA and the non-display area NDA. In an embodiment, the display area DA may be an area where the first substrate 100 and the display layer 400 overlap with each other. The non-display area NDA may be an area where the first substrate 100 and the display layer 400 do not overlap with each other.

The first substrate 100 may include glass. In another embodiment, the first substrate 100 may include a polymer resin, for example, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the first substrate 100 may have a multi-layered structure including a base layer including the polymer resin, and a barrier layer that are stacked on one another. For convenience, the first substrate 100 will be described in more detail hereinafter in the context of including glass.

The lower conductive layer 200 may be located on the first substrate 100. The lower conductive layer 200 may include a wiring. In an embodiment, the lower conductive layer 200 may include a plurality of wirings. The plurality of wirings may be located at (e.g., in or on) at least one of the display area DA and the non-display area NDA.

The planarization layer 300 may be located on the lower conductive layer 200. A top surface of the planarization layer 300 may be flat or substantially flat. Accordingly, the display layer 400 may be located on the flat or substantially flat top surface of the planarization layer 300, even though the lower conductive layer 200 is located on the first substrate 100. The planarization layer 300 may include an organic material. In an embodiment, the planarization layer 300 may include a polymer resin, for example, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In some embodiments, the planarization layer 300 may be omitted as needed or desired.

The display layer 400 may be located on the planarization layer 300. In an embodiment, the display layer 400 may overlap with the display area DA. In an embodiment, the display layer 400 may include a pixel circuit layer and a display element layer. The pixel circuit layer may include a pixel circuit and an insulating layer. The display element layer may include a display element that is driven by the pixel circuit. In an embodiment, the display element may be an organic light-emitting diode including an organic emission layer. In another embodiment, the display element may be a light-emitting diode (LED) including an inorganic emission layer. The light-emitting diode may have a micro-scale or nano-scale size. For example, the light-emitting diode may be a micro light-emitting diode. In another embodiment, the light-emitting diode may be a nano-rod light-emitting diode. The nano-rod light-emitting diode may include gallium nitride (GaN). In an embodiment, a color conversion layer may be located on the nano-rod light-emitting diode. The color conversion layer may include quantum dots. In another embodiment, the display element may be a quantum dot light-emitting diode including a quantum dot emission layer.

The second substrate 500 may be located on the display layer 400. In other words, the display layer 400 may be located between the first substrate 100 and the second substrate 500. The second substrate 500 may be a transparent member. In an embodiment, the second substrate 500 may include glass.

The sealing member 600 may be located between the first substrate 100 and the second substrate 500. In an embodiment, the sealing member 600 may surround (e.g., around a periphery of) the display area DA, and may be located at (e.g., in or on) the non-display area NDA. In an embodiment, the sealing member 600 may at least partially overlap with the lower conductive layer 200. The sealing member 600 may connect (e.g., may couple or attach) the planarization layer 300 to the second substrate 500. When the planarization layer 300 is not provided (e.g., is omitted), the sealing member 600 may connect (e.g., may couple or attach) the first substrate 100 to the second substrate 500. Accordingly, an inner space between the planarization layer 300 and the second substrate 500 may be sealed, and a moisture absorbing material and/or a filler may be located in the inner space.

In an embodiment, the sealing member 600 may include (e.g., may be) a sealant. In another embodiment, the sealing member 600 may include a material that is cured by a laser. For example, the sealing member 600 may include (e.g., may be) a frit. In more detail, the sealing member 600 may include an organic sealant, for example, such as a urethane resin, an epoxy resin, or an acrylic resin, or an inorganic sealant. In an embodiment, the sealing member 600 may include silicone. Examples of the urethane resin may include urethane acrylate. Examples of the acrylic resin may include butyl acrylate and ethylhexyl acrylate. The sealing member 600 may include a suitable material that is cured by heat.

In another embodiment, instead of the second substrate 500, an encapsulation layer may be located on the display layer 400. The encapsulation layer may include at least one inorganic encapsulation layer and at least one organic encapsulation layer. In an embodiment, the at least one inorganic encapsulation layer and the at least one organic encapsulation layer may be alternately stacked. The inorganic encapsulation layer may include at least one inorganic material selected from aluminum oxide ($Al_2O_3$), titanium oxide ($TiO_2$), tantalum oxide ($Ta_2O_5$), zinc oxide ($ZnO_x$), silicon oxide ($SiO_x$), silicon nitride ($SiN_x$), and silicon oxynitride (SiON). In an embodiment, the zinc oxide ($ZnO_x$) may be zinc oxide (ZnO) and/or zinc peroxide ($ZnO_2$). The organic encapsulation layer may include a polymer-based material. Examples of the polymer-based material may include an acrylic resin, an epoxy resin, polyimide, and polyethylene. In an embodiment, the organic encapsulation layer may include acrylate. In another embodiment, the encapsulation layer and the second substrate 500 may both be located on the display layer 400.

A touch sensor layer may be located on the second substrate 500. The touch sensor layer may obtain coordinate information according to an external input, for example, such as a touch event.

An anti-reflection layer may be located on the touch sensor layer. The anti-reflection layer may reduce a reflectance of light (e.g., external light) incident on the display apparatus 1. In an embodiment, the anti-reflection layer may include a phase retarder and/or a polarizer. The phase retarder may be a film type phase retarder or a liquid crystal coating type phase retarder, and may include a half-wave ($\lambda/2$) phase retarder and/or a quarter-wave ($\lambda/4$) phase retarder. The polarizer may also be a film type polarizer or a liquid crystal coating type polarizer. The film type polarizer may include a stretchable synthetic resin film, and the liquid crystal coating type polarizer may include liquid crystals arranged in a suitable arrangement (e.g., a certain or predetermined arrangement). The phase retarder and the polarizer may further include a protective film.

In another embodiment, the anti-reflection layer may include a black matrix and color filters. The color filters may be arranged in consideration of a color of light emitted by the display element of the display apparatus 1. Each of the color filters may include a red, green, or blue pigment or dye. As another example, each of the color filters may further include quantum dots in addition to the pigment or dye. As another example, some of the color filters may not include the pigment or dye, and may include scattering particles, for example, such as titanium oxide.

In another embodiment, the anti-reflection layer may have a destructive interference structure. The destructive interference structure may include a first reflective layer and a second reflective layer that are located on different layers from each other. First reflected light and second reflected light reflected by the first reflective layer and the second reflective layer, respectively, may be destructively interfered with each other, thereby reducing a reflectance of external light.

FIG. 3 is a plan view illustrating the display apparatus 1 of FIG. 1. The display apparatus 1 of FIG. 3 may correspond to a plan view of the display apparatus 1 shown in FIG. 2, but with the second substrate 500 removed for convenience of illustration. In FIG. 3, the same or substantially the same elements as those illustrated in FIG. 2 are denoted by the same reference numerals, and thus, redundant description thereof may not be repeated.

Referring to FIG. 3, the display apparatus 1 may include the first substrate 100, the pixel PX, a scan line SL, a data line DL, a pad PAD, the lower conductive layer 200, and the sealing member 600. The first substrate 100 may include the display area DA and the non-display area NDA. The display area DA may be an area where the display apparatus 1 displays an image. The pixel PX may be located at (e.g., in or on) the display area DA. The non-display area NDA may be an area where the display apparatus 1 does not display an image. A driving circuit and/or a power supply wiring of the display apparatus 1 may be located at (e.g., in or on) the non-display area NDA. In an embodiment, the non-display area NDA may at least partially surround (e.g., around a periphery of) the display area DA. For example, the non-display area NDA may entirely surround (e.g., around a periphery of) the display area DA.

The non-display area NDA may include a pad area PADA. In an embodiment, the pad area PADA may be located at an edge of the first substrate 100. The pad area PADA may be located outside the display area DA. The pad PAD may be located at (e.g., in or on) the pad area PADA.

The pixel PX may be located at (e.g., in or on) the display area DA. The pixel PX may emit light. In an embodiment, a plurality of pixels PX may be provided, and the display apparatus 1 may display an image by using light emitted by the plurality of pixels PX.

The pixel PX may be electrically connected to the scan line SL, which may transmit a scan signal, and the data line DL, which may transmit a data signal. The pixel PX may receive the scan signal and the data signal, and may emit light.

The scan line SL may transmit the scan signal to the pixel PX. In an embodiment, the scan line SL may extend in a first direction (e.g., an x direction or a −x direction). The scan line SL may be electrically connected to the pixel PX. In an embodiment, the scan line SL may receive the scan signal from a driving circuit (e.g., a scan driver).

The data line DL may transmit the data signal. In an embodiment, the data line DL may extend in a second direction (e.g., a y direction or a −y direction). The data line DL may be electrically connected to the pixel PX.

The pad PAD may be located at (e.g., in or on) the pad area PADA. In an embodiment, a plurality of pads PAD may be located at (e.g., in or on) the pad area PADA. In an embodiment, the plurality of pads PAD may be arranged along an edge of the first substrate 100. The pad PAD may be electrically connected to a printed circuit board or a semiconductor chip. In an embodiment, the printed circuit board may be bonded to the pad PAD in the form of a flexible printed circuit on glass (FOG). In an embodiment, the printed circuit board may be bonded to the pad PAD in the form of a flexible printed circuit on film (FOF). In an embodiment, the semiconductor chip may be bonded to the pad PAD in the form of a chip on glass (COG). In an embodiment, the semiconductor chip may be bonded in the form of a chip on plastic (COP). In an embodiment, the semiconductor chip may be bonded to the printed circuit board in the form of a chip on film (COF).

The lower conductive layer 200 may be located on the first substrate 100. In an embodiment, the lower conductive layer 200 may include a fan-out wiring FWL. In an embodiment, a plurality of fan-out wirings FWL may be provided. The fan-out wiring FWL may extend from the pad area PADA to the display area DA. In an embodiment, the fan-out wiring FWL may be electrically connected to the pad PAD. Accordingly, the fan-out wiring FWL may transmit at least one of a scan signal, a data signal, and a power supply voltage from the pad area PADA to the display area DA.

The sealing member 600 may be located at (e.g., in or on) the non-display area NDA. In an embodiment, the sealing member 600 may surround (e.g., around a periphery of) the display area DA. In a plan view, the sealing member 600 may overlap with the lower conductive layer 200. In an embodiment, the fan-out wiring FWL may at least partially overlap with the sealing member 600. For example, the fan-out wiring FWL may cross the sealing member 600.

FIG. 4 is an equivalent circuit diagram illustrating the pixel PX of the display apparatus, according to an embodiment.

Referring to FIG. 4, the pixel PX may include a pixel circuit PC, and a display element DPE that is electrically connected to the pixel circuit PC. The pixel circuit PC may include a driving thin-film transistor T1, a switching thin-film transistor T2, and a storage capacitor Cst. For example, the pixel PX may emit red light, green light, or blue light, or may emit red light, green light, blue light, or white light, through the display element DPE.

The switching thin-film transistor T2 may be connected to the scan line SL and the data line DL, and may transmit, to the driving thin-film transistor T1, a data voltage or a data signal Dm input from the data line DL according to a scan voltage or a scan signal Sn input from the scan line SL.

The storage capacitor Cst may be connected to the switching thin-film transistor T2 and a driving voltage line PL. The storage capacitor Cst may store a voltage corresponding to a difference between a voltage received from the switching thin-film transistor T2 and a first power supply voltage ELVDD supplied from the driving voltage line PL.

The driving thin-film transistor T1 may be connected to the driving voltage line PL and the storage capacitor Cst, and may control a driving current flowing from the driving voltage line PL to the display element DPE in response to a value (e.g., a level) of a voltage stored in the storage capacitor Cst. The display element DPE may emit light having a desired luminance (e.g., a certain or predetermined luminance) due to the driving current. A counter electrode (e.g., a cathode) of the display element DPE may receive a second power supply voltage ELVSS.

Although the pixel circuit PC shown in FIG. 4 includes two thin-film transistors and one storage capacitor, in another embodiment, the pixel circuit PC may include three or more thin-film transistors and/or two or more storage capacitors.

FIG. 5 is a cross-sectional view illustrating the display apparatus 1 taken along the lines B-B' and C-C' of FIG. 3, according to an embodiment. In FIG. 5, the same or substantially the same elements as those illustrated in FIG. 3 are denoted by the same reference numerals, and thus, redundant description thereof may not be repeated.

Referring to FIG. 5, the display apparatus 1 may include the first substrate 100, the lower conductive layer 200, the planarization layer 300, the display layer 400, and the pad PAD. The first substrate 100 may include the display area DA and the pad area PADA. The pad area PADA may be located outside the display area DA.

The lower conductive layer 200 may be located on the first substrate 100. The lower conductive layer 200 may include a wiring. In an embodiment, the lower conductive layer 200 may include the fan-out wiring FWL and a first lower connection wiring LCL1. The fan-out wiring FWL may extend from the pad area PADA to the display area DA. The first lower connection wiring LCL1 may be located at (e.g., in or on) the display area DA. The lower conductive layer 200 may include a low-resistance material. Accordingly, the fan-out wiring FWL and the first lower connection wiring LCL1 may be low-resistance wirings, and a load may be reduced.

The planarization layer 300 may be located on the lower conductive layer 200. The planarization layer 300 may cover the wiring. In an embodiment, the planarization layer 300 may cover the first lower connection wiring LCL1 and the fan-out wiring FWL. A top surface of the planarization layer 300 may be flat or substantially flat. Accordingly, the display layer 400 may be located on the flat top surface of the planarization layer 300, even though the lower conductive layer 200 is located on the first substrate 100. In an embodiment, a thickness 300t of the planarization layer 300 may be equal to or less than 5 μm. The thickness 300t of the planarization layer 300 may correspond to (e.g., may be defined by) a distance (e.g., a shortest distance) between a bottom surface and a top surface of the planarization layer 300 in a third direction (e.g., a z direction or a –z direction). The bottom surface of the planarization layer 300 may be a surface facing a top surface of the first substrate 100, and the top surface of the planarization layer 300 may be opposite to the bottom surface of the planarization layer 300 in the third direction (e.g., a z direction or a –z direction). In an embodiment, the planarization layer 300 may be omitted as needed or desired.

The display layer 400 may be located on the planarization layer 300. The display layer 400 may include a pixel circuit layer PCL and a display element layer DEL. The pixel circuit layer PCL may be located on the planarization layer 300. The pixel circuit layer PCL may include a first inorganic insulating layer 410, a second inorganic insulating layer 420, a third inorganic insulating layer 430, a pixel circuit PC, and an organic insulating layer OIL. In an embodiment, the pixel circuit PC may include at least one thin-film transistor TFT, and a storage capacitor Cst. The thin-film transistor TFT may include a semiconductor layer Act, a gate electrode GE, a source electrode SE, and a drain electrode DE. The storage capacitor Cst may include a lower electrode CE1 and an upper electrode CE2.

The first inorganic insulating layer 410 may be located on the planarization layer 300. In other words, the planarization layer 300 may be located between the first inorganic insulating layer 410 and the lower conductive layer 200. The first inorganic insulating layer 410 may overlap with the display area DA and the pad area PADA. In an embodiment, the first inorganic insulating layer 410 may be located on the lower conductive layer 200. In an embodiment, the first inorganic insulating layer 410 may include (e.g., may be) a buffer layer. The first inorganic insulating layer 410 may include an inorganic insulating material, for example, such as silicon nitride ($SiN_x$), silicon oxynitride (SiON), or silicon oxide ($SiO_x$), and may have a single-layer structure or a multi-layered structure including the inorganic insulating material.

The semiconductor layer Act may be located on the first inorganic insulating layer 410. The semiconductor layer Act may overlap with the display area DA. The semiconductor layer Act may include polysilicon. In another embodiment, the semiconductor layer Act may include amorphous silicon, an oxide semiconductor, or an organic semiconductor. In an embodiment, the semiconductor layer Act may include a channel region, and a source region and a drain region located at (e.g., in or on) opposite sides (e.g., opposite ends) of the channel region.

The second inorganic insulating layer 420 may cover the semiconductor layer Act. The second inorganic insulating layer 420 may overlap with the display area DA and the pad area PADA. In an embodiment, the second inorganic insulating layer 420 may include (e.g., may be) a first gate insulating layer. The second inorganic insulating layer 420 may include an inorganic insulating material, for example, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The gate electrode GE may be located on the second inorganic insulating layer 420. The gate electrode GE may overlap with the semiconductor layer Act. In an embodiment, the gate electrode GE may overlap with the channel region of the semiconductor layer Act.

The lower electrode CE1 may be located on the second inorganic insulating layer 420. In an embodiment, the lower electrode CE1 and the gate electrode GE may be spaced apart from each other. In another embodiment, the lower electrode CE1 and the gate electrode GE may be integrally formed with each other. For convenience, the lower electrode CE1 and the gate electrode GE will be described in more detail hereinafter in the context of being spaced apart from each other.

The gate electrode GE and the lower electrode CE1 may be located at (e.g., in or on) the same layer as each other. In this case, the gate electrode GE and the lower electrode CE1 may be included in (e.g., may be parts of) a first conductive layer CDL1. The first conductive layer CDL1 may include a conductive material including molybdenum (Mo), aluminum (Al), copper (Cu), or titanium (Ti), and may have a single-layer structure or a multi-layered structure including one or more of the above materials.

The third inorganic insulating layer 430 may cover the gate electrode GE and the lower electrode CE1. In an embodiment, the third inorganic insulating layer 430 may be located on the first conductive layer CDL1. The third inorganic insulating layer 430 may overlap with the display area DA and the pad area PADA. In an embodiment, the third inorganic insulating layer 430 may include (e.g., may be) a second gate insulating layer. The third insulating layer 430 may include an inorganic insulating material, for example, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The source electrode SE, the drain electrode DE, the upper electrode CE2, and a pad electrode PE may be located on the third inorganic insulating layer 430. Each of the source electrode SE and the drain electrode DE may be electrically connected to the semiconductor layer Act. In an embodiment, at least one of the source electrode SE and the drain electrode DE may be electrically connected to the first lower connection wiring LCL1. For example, the planarization layer 300 may include a lower hole 300IH. The first inorganic insulating layer 410 may include a first insulating layer hole 410IH. The semiconductor layer Act may include a semiconductor layer hole ActH. The second inorganic insulating layer 420 may include a second insulating layer hole 420IH. The third inorganic insulating layer 430 may include a third insulating layer hole 430IH. In this case, at least one of the source electrode SE and the drain electrode DE may be electrically connected to the first lower connection wiring LCL1 through the lower hole 300IH, the first insulating layer hole 410IH, the semiconductor layer hole ActH, the second insulating layer hole 420IH, and the third insulating layer hole 430IH. In an embodiment, the semiconductor layer Act may be electrically connected to at least one of the source electrode SE and the drain electrode DE through an inner surface of the semiconductor layer Act defining the semiconductor layer hole ActH. Accordingly, the thin-film transistor TFT may receive a signal and/or a power supply voltage through the first lower connection wiring LCL1, which may be a low-resistance wiring.

The upper electrode CE2 may overlap with the lower electrode CE1. In an embodiment, the thin-film transistor TFT and the storage capacitor Cst may not overlap with each other as shown in FIG. 5. In another embodiment, the thin-film transistor TFT and the storage capacitor Cst may overlap with each other. In this case, the gate electrode GE and the lower electrode CE1 may be integrally formed with each other.

The pad electrode PE may overlap with the pad area PADA. In an embodiment, the pad electrode PE may be located on the second inorganic insulating layer 420. The pad electrode PE may be included in the pad PAD. The pad electrode PE may be electrically connected to the fan-out wiring FWL. In an embodiment, the pad electrode PE and the fan-out wiring FWL may be electrically connected to each other through pad holes of (e.g., penetrating through) insulating layers located between the pad electrode PE and the fan-out wiring FWL. For example, the planarization layer 300 may include a lower pad hole 300PH. The first inorganic insulating layer 410 may include a first pad hole 410PH. The second inorganic insulating layer 420 may include a second pad hole 420PH. The third inorganic insulating layer 430 may include a third pad hole 430PH. In this case, the pad electrode PE may be electrically connected to the fan-out wiring FWL through the lower pad hole 300PH, the first pad hole 410PH, the second pad hole 420PH, and the third pad hole 430PH. Accordingly, a signal and/or a power supply voltage received from the pad electrode PE may be transmitted through the fan-out wiring FWL, which may be a low-resistance wiring.

The source electrode SE, the drain electrode DE, the upper electrode CE2, and the pad electrode PE may be located at (e.g., in or on) the same layer as each other. In this case, the source electrode SE, the drain electrode DE, the upper electrode CE2, and the pad electrode PE may be included in (e.g., may be parts of) a second conductive layer CDL2. The second conductive layer CDL2 may include a low-resistance material. The second conductive layer CDL2 may include a conductive material including molybdenum (Mo), aluminum (Al), copper (Cu), or titanium (Ti), and may have a single-layer structure or a multi-layered structure including one or more of the above materials. In an embodiment, the second conductive layer CDL2 may have a multi-layered structure including Ti/Al/Ti. In the present embodiment, because the source electrode SE, the drain electrode DE, the upper electrode CE2, and the pad electrode PE are located at (e.g., in or on) the same layer as each other, a manufacturing process of the display apparatus 1 may be simplified.

The organic insulating layer OIL may be located on the third inorganic insulating layer 430. The organic insulating layer OIL may cover the second conductive layer CDL2. In an embodiment, the organic insulating layer OIL may be located between the second conductive layer CDL2 and the display element layer DEL. Although the organic insulating layer OIL does not overlap with the pad electrode PE in the embodiment shown in FIG. 5, in another embodiment, the organic insulating layer OIL may at least partially overlap with the pad electrode PE. In this case, the organic insulating layer OIL may include an organic insulating layer pad hole overlapping with the pad electrode PE. The organic insulating layer OIL may include an organic material. The organic insulating layer OIL may include an organic insulating material, for example, such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a suitable blend thereof.

The display element layer DEL may be located on the pixel circuit layer PCL. The display element layer DEL may include the display element DPE and a pixel-defining film 460. The display element DPE may be an organic light-emitting diode. In an embodiment, the display element DPE may include a pixel electrode 451, an emission layer 453, and a counter electrode 455.

The pixel electrode 451 may be located on the organic insulating layer OIL. The pixel electrode 451 may be electrically connected to the thin-film transistor TFT. In an embodiment, the organic insulating layer OIL may include a contact hole OILCH. In this case, the pixel electrode 451 may be electrically connected to any one of the source electrode SE and the drain electrode DE through the contact hole OILCH of the organic insulating layer OIL. In an embodiment, the pixel electrode 451 may be directly connected to any one of the source electrode SE and the drain electrode DE through the contact hole OILCH of the organic insulating layer OIL.

Unlike in the present embodiment, when an additional connection electrode is located on the organic insulating layer OIL, an upper organic insulating layer covering the additional connection electrode is located on the additional connection electrode, and a display element layer is located on the upper organic insulating layer, the pixel electrode 451 may be electrically connected to the thin-film transistor TFT through the additional connection electrode. In this case, when the additional connection electrode is formed on the upper organic insulating layer, particles may be generated, thereby reducing the reliability of the display apparatus 1.

Further, when the display apparatus 1 includes the organic insulating layer OIL and the upper organic insulating layer, because a thickness of a layer including an organic material is increased, the display apparatus 1 may be vulnerable to shrinkage, and a lifetime of the display apparatus 1 may be reduced. However, in the present embodiment, because one organic insulating layer OIL is included, and the additional connection electrode is not provided, the reliability of the display apparatus 1 may be increased.

The pixel electrode 451 may include a conductive oxide, for example, such as indium tin oxide (ITO), indium zinc oxide (IZO), zinc oxide (ZnO), indium oxide (In$_2$O$_3$), indium gallium oxide (IGO), or aluminum zinc oxide (AZO). In another embodiment, the pixel electrode 451 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a suitable compound thereof. In another embodiment, the pixel electrode 451 may further include a film formed of ITO, IZO, ZnO, or In$_2$O$_3$ over and/or under the reflective film.

The pixel-defining film 460 may be located on the pixel electrode 451. The pixel-defining film 460 may include an opening portion 460OP exposing a central portion of the pixel electrode 451. The pixel-defining film 460 may include an organic insulating material and/or an inorganic insulating material. In some embodiments, the pixel-defining film 460 may include a light blocking material. The opening portion 460OP of the pixel-defining film 460 may define an emission area of light emitted by the display element DPE.

In an embodiment, the pixel-defining film 460 may include a spacer SPC protruding in a thickness direction (e.g., the z direction) of the first substrate 100. The spacer SPC may protrude in the third direction (e.g., the z direction or the –z direction) from the pixel-defining film 460. The pixel-defining film 460 including the spacer SPC may be formed by using a halftone mask. In some embodiments, the spacer SPC may include a material that is different from that of the pixel-defining film 460, and may be located on the pixel-defining film 460.

The emission layer 453 may be located in the opening 460OP of the pixel-defining film 460. The emission layer 453 may include a high molecular weight organic material or a low molecular weight organic material for emitting light of a desired color (e.g., a certain or predetermined color). In some embodiments, a first functional layer and a second functional layer may be further located, respectively, under and over the emission layer 453. For example, the first functional layer may include a hole transport layer (HTL), or may include a hole transport layer and a hole injection layer (HIL). The second functional layer may include an electron transport layer (ETL) and/or an electron injection layer (EIL). However, the second functional layer, which may be located on the emission layer 453, may be omitted as needed or desired. The first functional layer and/or the second functional layer may be a common layer entirely covering the display area DA, like that of the counter electrode 455 described in more detail below.

The counter electrode 455 may be located on the emission layer 453. In an embodiment, the counter electrode 455 may entirely cover the display area DA. The counter electrode 455 may be formed of a conductive material having a low work function. For example, the counter electrode 455 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a suitable alloy thereof. In another embodiment, the counter electrode 455 may further include a layer formed of ITO, IZO, ZnO, or In$_2$O$_3$ on the (semi)transparent layer including one or more of the above materials.

In some embodiments, one display element DPE may include a plurality of emission layers 453, which are sequentially stacked. For example, one display element DPE may include a first emission layer and a second emission layer, which are sequentially stacked. A negative charge generation layer and a positive charge generation layer may be located between adjacent emission layers. For example, the negative charge generation layer and the positive charge generation layer may be located between the first emission layer and the second emission layer. In this case, the pixel electrode 451, the first emission layer, the negative charge generation layer, the positive charge generation layer, the second emission layer, and the counter electrode 455 may be sequentially stacked in one display element DPE. The negative charge generation layer may supply electrons. The negative charge generation layer may be an n-type charge generation layer. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

In another example, one display element DPE may include a first emission layer, a second emission layer, and a third emission layer, which are sequentially stacked. A negative charge generation layer and a positive charge generation layer may be located between adjacent emission layers. For example, a first negative charge generation layer and a first positive charge generation layer may be located between the first emission layer and the second emission layer. A second negative charge generation layer and a second positive charge generation layer may be located between the second emission layer and the third emission layer. In this case, the pixel electrode 451, the first emission layer, the first negative charge generation layer, the first positive charge generation layer, the second emission layer, the second negative charge generation layer, the second positive charge generation layer, the third emission layer, and the counter electrode 455 may be sequentially stacked in one display element DPE. As such, when one display element DPE includes a plurality of emission layers 453, which are sequentially stacked, a luminance of the display element DPE may be improved, and a lifespan of the display element DPE may be increased.

FIGS. 6A and 6B are enlarged views illustrating the portion D of the display apparatus 1 of FIG. 5, according to various embodiments. In FIGS. 6A and 6B, the same or substantially the same elements as those illustrated in FIG. 5 are denoted by the same reference numerals, and thus, redundant description thereof may not be repeated.

Referring to FIGS. 6A and 6B, the display apparatus may include the first substrate 100, the lower conductive layer 200, and the planarization layer 300. The lower conductive layer 200 may be located on the first substrate 100, and the planarization layer 300 may be located on the lower conductive layer 200.

Referring to FIG. 6A, the lower conductive layer 200 may include a first layer L1 and a second layer L2. The first layer L1 may include a first metal. The first metal may be a low-resistance material. The first metal may include at least one of aluminum (Al) and copper (Cu). In some embodiments, the first metal may include an aluminum alloy or a copper alloy. In some embodiments, the first layer L1 may include aluminum (Al) and aluminum oxide ($Al_2O_3$). In a case where the first layer L1 includes aluminum oxide ($Al_2O_3$), even when the second layer L2 includes titanium (Ti), diffusion between the first layer L1 and the second layer L2 may be reduced or prevented. In some embodiments, the first layer L1 may include a fluorine component.

The second layer L2 may be located on the first layer L1. The second layer L2 may prevent or reduce hillock defects of the first layer L1. In an embodiment, the second layer L2 may include a second metal that is different from the first metal of the first layer L1. For example, the second metal may include at least one of titanium (Ti) and molybdenum (Mo). In another embodiment, the second layer L2 may include an inorganic material. For example, the second layer L2 may include silicon nitride ($SiN_x$). When the second layer L2 includes silicon nitride ($SiN_x$), diffusion between the second layer L2 and the first layer L1 may be reduced or prevented.

Referring to FIG. 6B, the lower conductive layer 200 may include a lower layer LL, the first layer L1, and the second layer L2, which are sequentially stacked. The lower layer LL may include at least one of titanium (Ti) and molybdenum (Mo). In an embodiment, the lower layer LL may include titanium (Ti), the first layer L1 may include aluminum (Al), and the second layer L2 may include titanium (Ti).

Referring to FIGS. 6A and 6B together, the lower conductive layer 200 may include a low-resistance material, and may have high reliability. Accordingly, wirings included in the lower conductive layer 200 may be low-resistance wirings, and may have high reliability.

The planarization layer 300 may be located on the lower conductive layer 200. A top surface of the planarization layer 300 may be flat or substantially flat. In this case, even when a thickness is increased to reduce the resistance of the lower conductive layer 200, a layer, for example, such as a semiconductor layer, located on the planarization layer 300 may be located on the flat top surface of the planarization layer 300. Accordingly, the reliability of the display apparatus may be improved.

FIG. 7A is a cross-sectional view illustrating a state in which the lower conductive layer 200 and the second conductive layer CDL2 are connected to each other. FIG. 7B is a cross-sectional view illustrating a state in which the lower conductive layer 200 and the first conductive layer CDL1 are connected to each other.

In FIGS. 7A and 7B, the same or substantially the same elements as those illustrated in FIG. 5 are denoted by the same reference numerals, and thus, redundant description thereof may not be repeated.

Referring to FIG. 7A, the display apparatus may include the first substrate 100, the lower conductive layer 200, the planarization layer 300, the first inorganic insulating layer 410, the second inorganic insulating layer 420, the third inorganic insulating layer 430, the second conductive layer CDL2, and the organic insulating layer OIL, which are sequentially stacked. In an embodiment, the lower conductive layer 200 may include a second lower connection wiring LCL2. The second conductive layer CDL2 may include a first connection wiring CL1. The first connection wiring CL1 may be located on the third inorganic insulating layer 430. In an embodiment, the first connection wiring CL1 may be located between the third inorganic insulating layer 430 and the organic insulating layer OIL.

In an embodiment, each of the planarization layer 300, the first inorganic insulating layer 410, the second inorganic insulating layer 420, and the third inorganic insulating layer 430 may include a hole. The first connection wiring CL1 located on the third inorganic insulating layer 430 may be electrically connected to the second lower connection wiring LCL2 through a hole 300H of the planarization layer 300, a hole 410H of the first inorganic insulating layer 410, a hole 420H of the second inorganic insulating layer 420, and a hole 430H of the third inorganic insulating layer 430. Accordingly, a power supply voltage and/or a signal received from a wiring of the lower conductive layer 200 may be transmitted to a wiring of the second conductive layer CDL2.

Referring to FIG. 7B, the display apparatus may include the first substrate 100, the lower conductive layer 200, the planarization layer 300, the first inorganic insulating layer 410, the second inorganic insulating layer 420, the first conductive layer CDL1, the third inorganic insulating layer 430, the second conductive layer CDL2, and the organic insulating layer OIL. The lower conductive layer 200 may include a third lower connection wiring LCL3. The first conductive layer CDL1 may include a second connection wiring CL2. The second connection wiring CL2 may be located on the second inorganic insulating layer 420. In an embodiment, the second connection wiring CL2 may be located between the second inorganic insulating layer 420 and the third inorganic insulating layer 430. The second conductive layer CDL2 may include a connection electrode CNC. The connection electrode CNC may be located on the third inorganic insulating layer 430. In an embodiment, the connection electrode CNC may be located between the third inorganic insulating layer 430 and the organic insulating layer OIL.

The connection electrode CNC may be electrically connected to the third lower connection wiring LCL3. In an embodiment, each of the planarization layer 300, the first inorganic insulating layer 410, the second inorganic insulating layer 420, and the third inorganic insulating layer 430 may include a hole. The connection electrode CNC may be electrically connected to the third lower connection wiring LCL3 through the hole 300H of the planarization layer 300, the hole 410H of the first inorganic insulating layer 410, the hole 420H of the second inorganic insulating layer 420, and a first hole 430H1 of the third inorganic insulating layer 430.

The second connection wiring CL2 may be electrically connected to the connection electrode CNC. The second connection wiring CL2 may be electrically connected to the connection electrode CNC through a second hole 430H2 of the third inorganic insulating layer 430. Accordingly, a power supply voltage and/or a signal received from a wiring of the lower conductive layer 200 may be transmitted to a wiring of the first conductive layer CDL1.

FIG. 8 is an enlarged view illustrating the portion E of the display apparatus 1 of FIG. 3, according to an embodiment.

Referring to FIG. 8, the display apparatus may include the first substrate 100, the pixel circuit PC, and a wiring WL. The pixel circuit PC may be located on the first substrate 100. In an embodiment, a plurality of pixel circuits PC may be provided. In FIG. 8, the plurality of pixel circuits PC are arranged to be parallel to or substantially parallel to one another in the first direction (e.g., the x direction or the −x direction).

In an embodiment, the wiring WL may extend in the first direction (e.g., the x direction or the −x direction). In another embodiment, the wiring WL may extend in the second direction (e.g., the y direction or the −y direction). In an embodiment, the wiring WL may be a driving voltage line.

In another embodiment, the wiring WL may be a signal line. For example, the wiring WL may be a scan line or a data line.

FIGS. 9A and 9B are cross-sectional views illustrating the display apparatus taken along the line F-F' of FIG. 8, according to various embodiments. In FIGS. 9A and 9B, the same or substantially the same elements as those illustrated in FIG. 5 are denoted by the same reference numerals, and thus, redundant description thereof may not be repeated.

Referring to FIGS. 9A and 9B, the display apparatus may include the first substrate 100, the planarization layer 300, the first inorganic insulating layer 410, the second inorganic insulating layer 420, the third inorganic insulating layer 430, the wiring WL, and the organic insulating layer OIL.

Referring to FIG. 9A, the wiring WL may include a first lower wiring LWL1, an upper connection electrode UCM, and a second lower wiring LWL2. The first lower wiring LWL1 and the second lower wiring LWL2 may be located between the second inorganic insulating layer 420 and the third inorganic insulating layer 430. In an embodiment, the first lower wiring LWL1 and the second lower wiring LWL2 may be included in (e.g., may be parts of) the first conductive layer CDL1. The upper connection electrode UCM may be located between the third inorganic insulating layer 430 and the organic insulating layer OIL. The upper connection electrode UCM may be included in (e.g., may be a part of) the second conductive layer CDL2.

The upper connection electrode UCM may be electrically connected to the first lower wiring LWL1 through one hole of the third inorganic insulating layer 430. The upper connection electrode UCM may be electrically connected to the second lower wiring LWL2 through another hole of the third inorganic insulating layer 430. Accordingly, even when the first lower wiring LWL1 and the second lower wiring LWL2 are spaced apart from each other, the first lower wiring LWL1 and the second lower wiring LWL2 may be electrically connected to each other. The upper connection electrode UCM may function as a bridge.

Referring to FIG. 9B, the wiring WL may include a lower connection electrode LCM, a first upper wiring UWL1, and a second upper wiring UWL2. The lower connection electrode LCM may be located between the second inorganic insulating layer 420 and the third inorganic insulating layer 430. In an embodiment, the lower connection electrode LCM may be included in (e.g., may be a part of) the first conductive layer CDL1. The first upper wiring UWL1 and the second upper wiring UWL2 may be located between the third inorganic insulating layer 430 and the organic insulating layer OIL. The first upper wiring UWL1 and the second upper wiring UWL2 may be included in (e.g., may be parts of) the second conductive layer CDL2.

The first upper wiring UWL1 may be electrically connected to the lower connection electrode LCM through one hole of the third inorganic insulating layer 430. The second upper wiring UWL2 may be electrically connected to the lower connection electrode LCM through another hole of the third inorganic insulating layer 430. Accordingly, even when the first upper wiring UWL1 and the second upper wiring UWL2 are spaced apart from each other, the first upper wiring UWL1 and the second upper wiring UWL2 may be electrically connected to each other. The lower connection electrode LCM may function as a bridge.

FIGS. 10A through 10F are cross-sectional views illustrating various manufacturing processes of a display apparatus, according to an embodiment. In FIGS. 10A through 10F, the same or substantially the same elements as those illustrated in FIG. 5 are denoted by the same reference numerals, and thus, redundant description thereof may not be repeated.

Figure 10A:
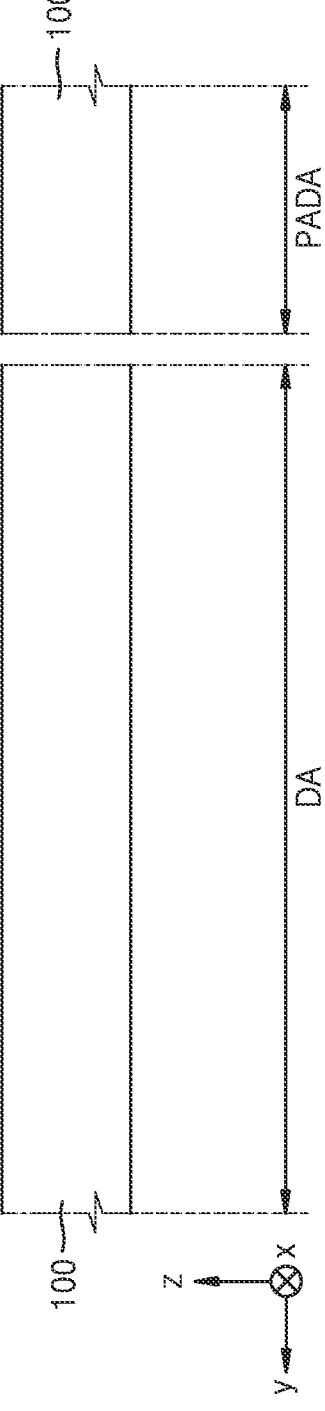

Referring to FIG. 10A, the first substrate 100 may be prepared. The first substrate 100 may include the display area DA and the pad area PADA. The pad area PADA may be located outside the display area DA.

Figure 10B:
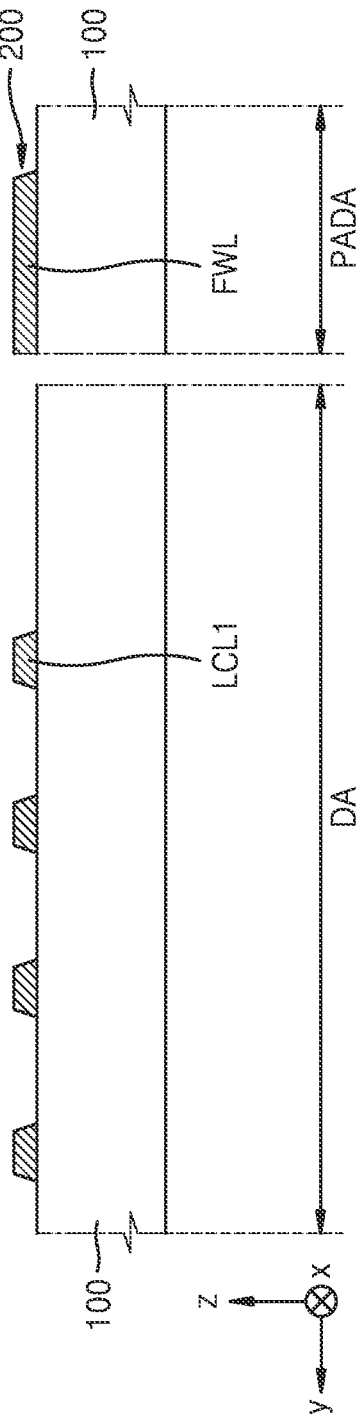

Referring to FIG. 10B, the lower conductive layer 200 may be located on the first substrate 100. The lower conductive layer 200 may include a wiring. In an embodiment, the lower conductive layer 200 may include the fan-out wiring FWL and the first lower connection wiring LCL1. The fan-out wiring FWL may extend from the pad area PADA to the display area DA. The first lower connection wiring LCL1 may be located at (e.g., in or on) the display area DA. The lower conductive layer 200 may be formed by using a low-resistance material.

Figure 10C:
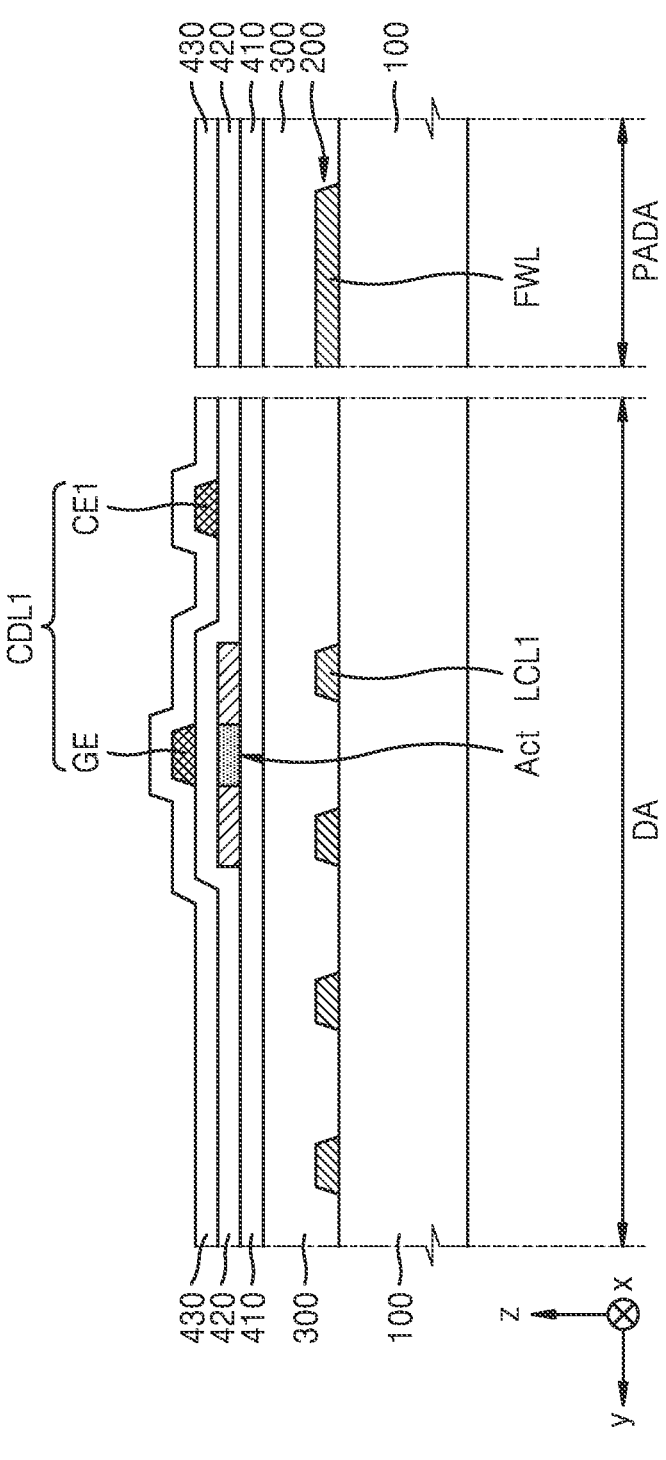

Referring to FIG. 10C, the planarization layer 300 may be located on the lower conductive layer 200. The planarization layer 300 may cover the wiring. In an embodiment, the planarization layer 300 may cover the first lower connection wiring LCL1 and the fan-out wiring FWL. A top surface of the planarization layer 300 may be flat or substantially flat.

Next, the first inorganic insulating layer 410, the semiconductor layer Act, the second inorganic insulating layer 420, the first conductive layer CDL1, and the third inorganic insulating layer 430 may be sequentially formed on the planarization layer 300. The first inorganic insulating layer 410 may be formed on the planarization layer 300. In an embodiment, the first inorganic insulating layer 410 may be formed on the lower conductive layer 200. The first inorganic insulating layer 410 may overlap with the display area DA and the pad area PADA.

The semiconductor layer Act may be formed on the first inorganic insulating layer 410. The semiconductor layer Act may overlap with the display area DA. The second inorganic insulating layer 420 may be formed on the semiconductor layer Act. The second inorganic insulating layer 420 may overlap with the display area DA and the pad area PADA. The first conductive layer CDL1 may be formed on the second inorganic insulating layer 420. In an embodiment, the first conductive layer CDL1 may include the lower electrode CE1 and the gate electrode GE. The third inorganic insulating layer 430 may be formed on the first conductive layer CDL1. The third inorganic insulating layer 430 may overlap with the display area DA and the pad area PADA.

Figure 10D:
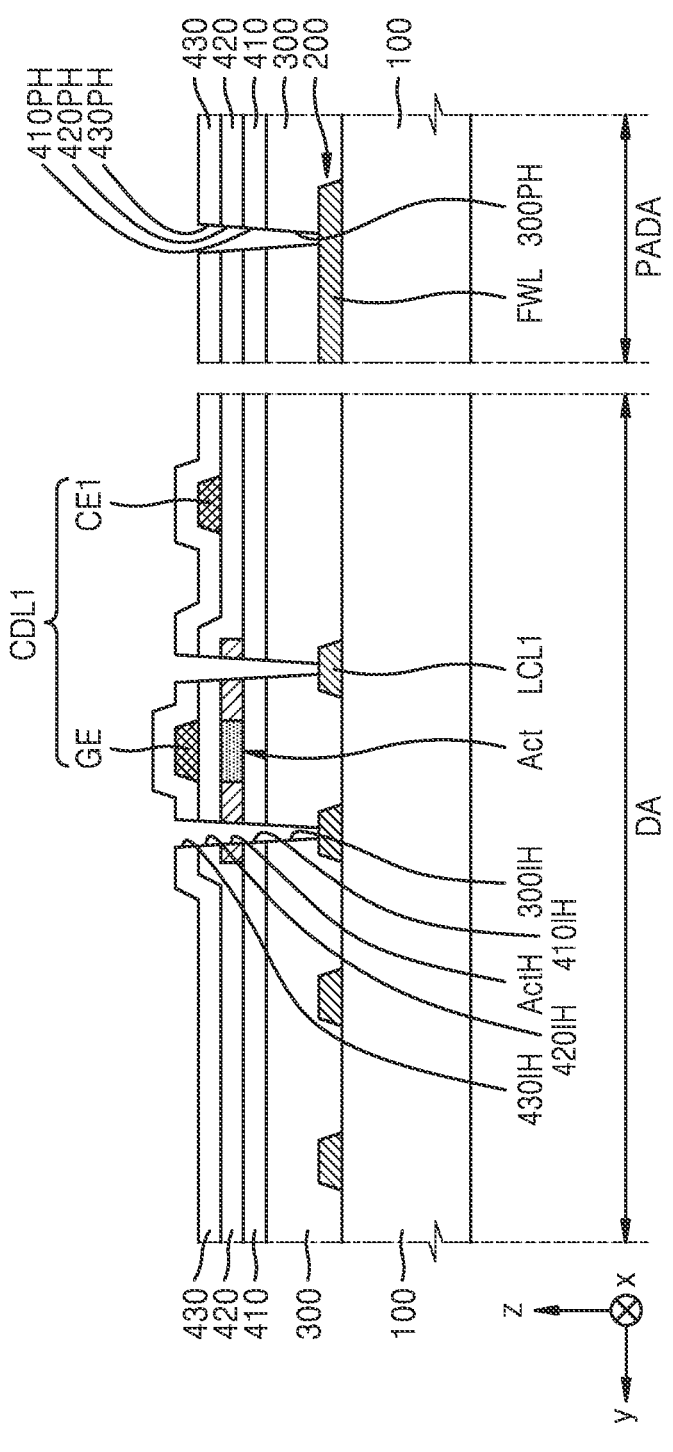

Referring to FIG. 10D, holes may be formed in the planarization layer 300, the first inorganic insulating layer 410, the semiconductor layer Act, the second inorganic insulating layer 420, and the third inorganic insulating layer 430. In an embodiment, the lower hole 300IH and a lower pad hole 300PH may be formed in the planarization layer 300. The first insulating layer hole 410IH and the first pad hole 410PH may be formed in the first inorganic insulating layer 410. The semiconductor layer hole ActH may be formed in the semiconductor layer Act. The second insulating layer hole 420IH and the second pad hole 420PH may be formed in the second inorganic insulating layer 420. The third insulating layer hole 430IH and the third pad hole 430PH may be formed in the third inorganic insulating layer 430.

Figure 10E:
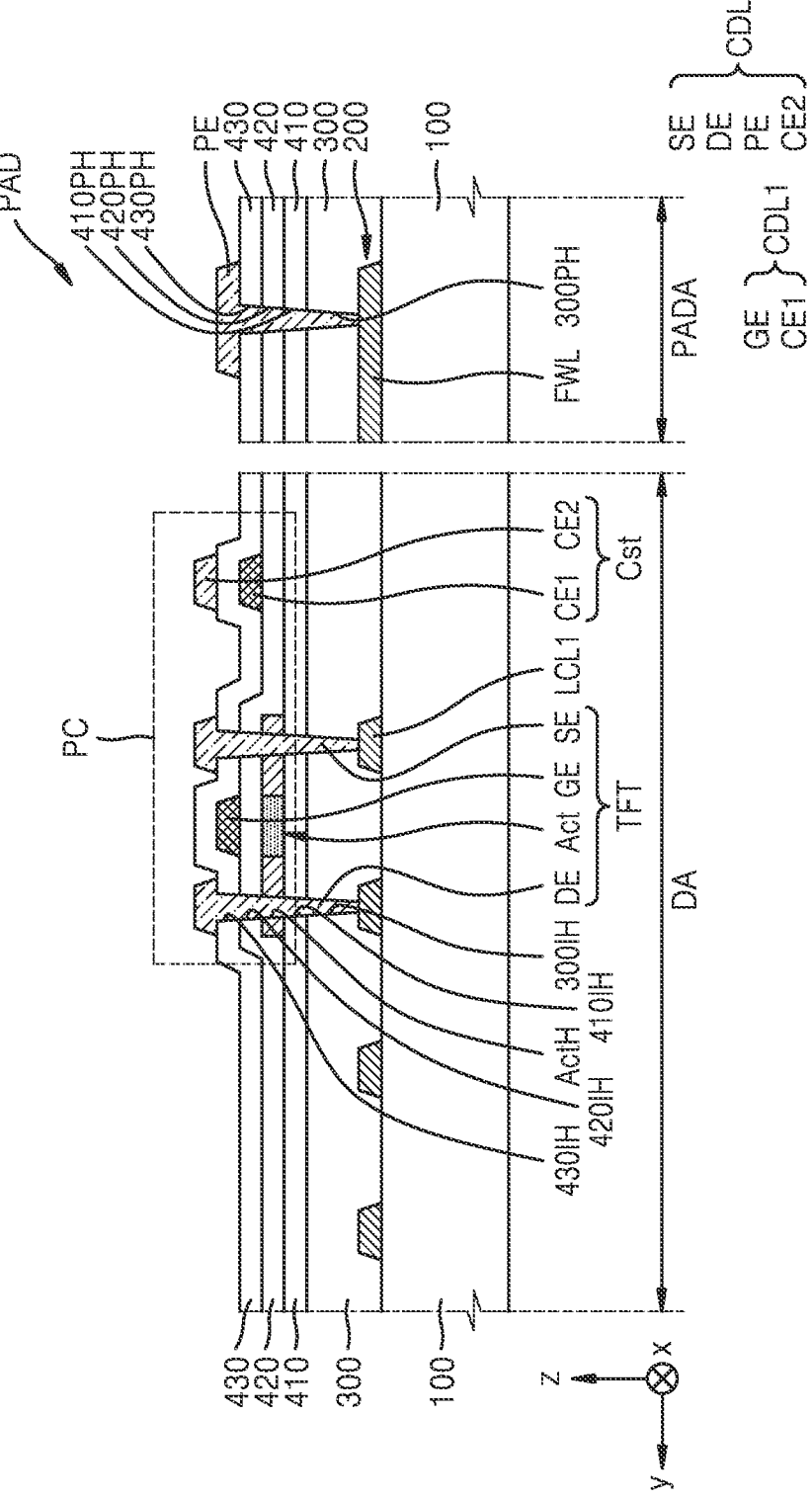

Referring to FIG. 10E, the second conductive layer CDL2 may be formed. In an embodiment, the second conductive layer CDL2 may include the source electrode SE, the drain electrode DE, the upper electrode CE2, and the pad electrode PE. The pad electrode PE may be included in the pad PAD.

The second conductive layer CDL2 may be electrically connected to the lower conductive layer 200. In an embodiment, at least one of the source electrode SE and the drain electrode DE may be electrically connected to the first lower connection wiring LCL1 through the lower hole 300IH, the first insulating layer hole 410IH, the second insulating layer hole 420IH, and the third insulating layer hole 430IH. Accordingly, the thin-film transistor TFT may receive a signal and/or a power supply voltage through the first lower connection wiring LCL1, which may be a low-resistance wiring. At least one of the source electrode SE and the drain electrode DE may be electrically connected to the semiconductor layer Act through an inner surface of the semiconductor layer Act defining the semiconductor layer hole ActH. In an embodiment, the pad electrode PE may be electrically connected to the fan-out wiring FWL through the lower pad hole 300PH, the first pad hole 410PH, the second pad hole 420PH, and the third pad hole 430PH. Accordingly, a signal and/or a power supply voltage received from the pad electrode PE may be transmitted through the fan-out wiring FWL, which may be a low-resistance wiring.

Figure 10F:
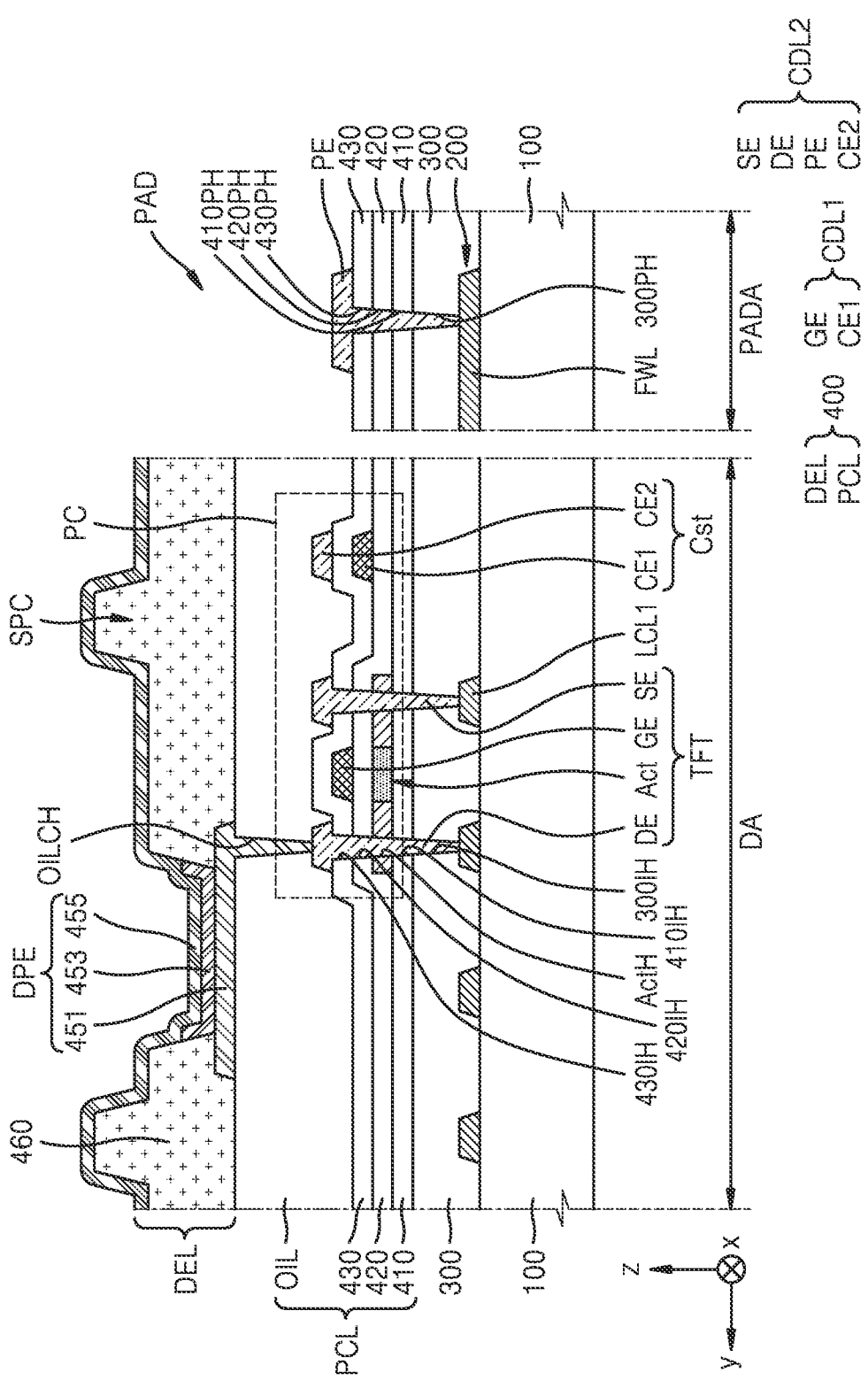

Referring to FIG. 10F, the organic insulating layer OIL may be formed. The organic insulating layer OIL may be formed on the third inorganic insulating layer 430 and the second conductive layer CDL2. The organic insulating layer OIL may include the contact hole OILCH.

Next, the display element layer DEL may be formed. The display element layer DEL may include the display element DPE. In an embodiment, the display element DPE may be an organic light-emitting diode. The display element DPE may include the pixel electrode 451, the emission layer 453, and the counter electrode 455. The pixel electrode 451 may be electrically connected to any one of the source electrode SE and the drain electrode DE through the contact hole OILCH of the organic insulating layer OIL. In an embodiment, the pixel electrode 451 may be directly connected to any one of the source electrode SE and the drain electrode DE through the contact hole OILCH of the organic insulating layer OIL.

As such, according to one or more embodiments, a display apparatus may be manufactured relatively simply according to the method shown in FIGS. 10A through 10F, and the number of masks used may be reduced. Also, costs for manufacturing the display apparatus may be reduced.

FIGS. 11A through 11C are cross-sectional views illustrating various manufacturing processes of the lower conductive layer 200, according to an embodiment. In FIGS. 11A through 11C, the same or substantially the same elements as those illustrated in FIG. 6A are denoted by the same reference numerals, and thus, redundant description thereof may not be repeated.

Referring to FIGS. 11A through 11C, the lower conductive layer 200 may be formed on the first substrate 100.

Referring to FIG. 11A, the first layer L1 including a first metal may be formed on the first substrate 100. The first metal may include (e.g., may be) a low-resistance material. The first metal may include at least one of aluminum (Al) and copper (Cu). In some embodiments, the first metal may include an aluminum alloy or a copper alloy.

In an embodiment, in the processes of forming the first substrate 100, the first layer L1 may be oxidized. In this case, the first layer L1 may include an oxide. For example, when the first layer L1 includes aluminum (Al) before the oxidation, the first layer L1 after the oxidation may include aluminum (Al) and aluminum oxide ($Al_2O_3$).

Referring to FIG. 11B, the second layer L2 may be formed on the first layer L1. The second layer L2 may prevent or reduce hillock defects of the first layer L1. In an embodiment, the second layer L2 may include a second metal that is different from the first metal of the first layer L1. For example, the second metal may include at least one of titanium (Ti) and molybdenum (Mo). In a case where the first layer L1 is oxidized and includes aluminum (Al) and aluminum oxide ($Al_2O_3$), even when the second layer L2 includes titanium (Ti), diffusion between the first layer L1 and the second layer L2 may be reduced or prevented. In another embodiment, the second layer L2 may include an inorganic material. For example, the second layer L2 may include silicon nitride ($SiN_x$). When the second layer L2 includes silicon nitride ($SiN_x$), diffusion between the second layer L2 and the first layer L1 may be reduced or prevented.

In an embodiment, before the first layer L1 and the second layer L2 are etched, the first layer L1 and the second layer L2 may be heat-treated. For example, the first layer L1 and the second layer L2 may be heat-treated at about 450° C. Because the first layer L1 and the second layer L2 are formed on the first substrate 100, the first layer L1 and the second layer L2 may be heat-treated at a high temperature before an element of the pixel circuit layer PCL is formed. Accordingly, the reliability of a wiring may be improved, and the influence of a subsequent process of forming the pixel circuit layer PCL on the first layer L1 and the second layer L2 may be reduced.

Referring to FIG. 11C, the first layer L1 and the second layer L2 may be etched. In an embodiment, after the first layer L1 and the second layer L2 are etched, a post-treatment process may be performed. For example, the first layer L1 and the second layer L2 may be processed by using carbon tetrafluoride ($CF_4$) and oxygen ($O_2$). In this case, corrosion of the lower conductive layer 200 may be prevented or reduced.

FIG. 12 is a cross-sectional view illustrating the display apparatus 1 taken along the lines B-B' and C-C' of FIG. 3, according to another embodiment. In FIG. 12, the same or substantially the same elements as those illustrated in FIG. 5 are denoted by the same reference numerals, and thus, redundant description thereof may not be repeated.

Referring to FIG. 12, the display apparatus 1 may include the first substrate 100, the lower conductive layer 200, the planarization layer 300, the display layer 400, and the pad PAD. The display layer 400 may include the pixel circuit layer PCL and the display element layer DEL. The pixel circuit layer PCL may be located on the planarization layer 300. The pixel circuit layer PCL may include the first inorganic insulating layer 410, the second inorganic insulating layer 420, the third inorganic insulating layer 430, the pixel circuit PC, a fourth inorganic insulating layer 440, and the organic insulating layer OIL.

The fourth inorganic insulating layer 440 may be located on the third inorganic insulating layer 430 and the second conductive layer CDL2. The fourth inorganic insulating layer 440 may overlap with the display area DA and the pad area PADA. The fourth inorganic insulating layer 440 may cover at least a part of the pad electrode PE, and may include an upper pad hole 440PH overlapping with the pad electrode PE. Accordingly, at least a part of the pad electrode PE may be exposed through the upper pad hole 440PH. The fourth inorganic insulating layer 440 may include a fourth insulating layer hole 440IH through which at least one of the source electrode SE and the drain electrode DE is exposed. The pixel electrode 451 may be directly connected to the source electrode SE or the drain electrode DE through the fourth insulating layer hole 440IH of the fourth inorganic insulating layer 440 and the contact hole OILCH of the organic insulating layer OIL. The fourth inorganic insulating layer 440 may include an inorganic insulating material, for example, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

In an embodiment, a second substrate may be located on the display layer 400. The fourth inorganic insulating layer 440 may prevent or reduce a short circuit between electrodes or wirings of the second conductive layer CDL2 when a foreign material located on the organic insulating layer OIL and/or the pixel-defining film 460 is pressed by the second substrate. Also, the fourth inorganic insulating layer 440 may protect the pad PAD.

FIGS. 13A and 13B are cross-sectional views illustrating various manufacturing processes of a display apparatus, according to another embodiment. In FIGS. 13A and 13B, the same or substantially the same elements as those illustrated in FIG. 10E are denoted by the same reference numerals, and thus, redundant description thereof may not be repeated.

Referring to FIGS. 13A and 13B, the fourth inorganic insulating layer 440 may be formed on the second conductive layer CDL2. In an embodiment, the fourth inorganic insulating layer 440 may be formed on the second conductive layer CDL2 and the third inorganic insulating layer 430.

The fourth inorganic insulating layer 440 may overlap with the display area DA and the pad area PADA. The fourth inorganic insulating layer 440 may cover at least a part of the pad electrode PE, and may include the upper pad hole 440PH overlapping with the pad electrode PE. Accordingly, at least a part of the pad electrode PE may be exposed through the upper pad hole 440PH. The fourth inorganic insulating layer 440 may include the fourth insulating layer hole 440IH through which at least one of the source electrode SE and the drain electrode DE is exposed.

As described above, a display apparatus according to one or more embodiments of the present disclosure may include a lower conductive layer located between a first substrate and a semiconductor layer. The lower conductive layer may include a wiring having low resistance and high reliability, and thus, the reliability of the display apparatus according to one or more embodiments may be improved.

A method of manufacturing a display apparatus according to one or more embodiments of the present disclosure may include forming a lower conductive layer on a first substrate, and sequentially forming a first inorganic insulating layer, a semiconductor layer, a second inorganic insulating layer, a first conductive layer, and a third inorganic insulating layer on the lower conductive layer. Accordingly, a manufacturing process of the display apparatus may be relatively simplified.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a first substrate comprising a display area, and a pad area located outside the display area;
a lower conductive layer located on the first substrate, and comprising a fan-out wiring extending from the pad area to the display area;
a first inorganic insulating layer located on and above the lower conductive layer;
a semiconductor layer located on and above the first inorganic insulating layer, and overlapping with the display area;
a second inorganic insulating layer covering the semiconductor layer, and overlapping with the display area and the pad area;
a pad electrode on the second inorganic insulating layer, the pad electrode overlapping with the pad area, and electrically connected to the fan-out wiring; and
a display element layer located on the second inorganic insulating layer, and comprising a display element overlapping with the display area.

2. The display apparatus of claim 1, wherein the pad electrode is electrically connected to the fan-out wiring through a first pad hole of the first inorganic insulating layer and a second pad hole of the second inorganic insulating layer.

3. The display apparatus of claim 1, wherein the lower conductive layer comprises:
a first layer comprising a first metal; and
a second layer located on the first layer, and comprising a second metal different from the first metal.

4. The display apparatus of claim 3, wherein the first metal comprises aluminum, and the second metal comprises titanium.

5. The display apparatus of claim 3, wherein the first layer comprises aluminum and an aluminum oxide, and the second layer comprises titanium.

6. The display apparatus of claim 1, wherein the lower conductive layer comprises:
a first layer comprising a first metal; and
a second layer located on the first layer, and comprising an inorganic material.

7. A display apparatus comprising:
a first substrate comprising a display area, and a pad area located outside the display area;
a lower conductive layer located on the first substrate, and comprising a fan-out wiring extending from the pad area to the display area;
a first inorganic insulating layer located on the lower conductive layer;
a semiconductor layer located on the first inorganic insulating layer, and overlapping with the display area;
a second inorganic insulating layer covering the semiconductor layer, and overlapping with the display area and the pad area;
a pad electrode on the second inorganic insulating layer, the pad electrode overlapping with the pad area, and electrically connected to the fan-out wiring;
a display element layer located on the second inorganic insulating layer, and comprising a display element overlapping with the display area; and a planarization layer located between the lower conductive layer and the first inorganic insulating layer.

8. The display apparatus of claim 1, further comprising:

a first conductive layer located on the second inorganic insulating layer, and comprising a gate electrode overlapping with the semiconductor layer;

a third inorganic insulating layer covering the gate electrode; and a second conductive layer located between the third inorganic insulating layer and the display element layer, and comprising a source electrode and a drain electrode, wherein the lower conductive layer further comprises a first lower connection wiring overlapping with the display area, and wherein one of the source electrode or the drain electrode is electrically connected to the first lower connection wiring through a first insulating layer hole of the first inorganic insulating layer, a semiconductor layer hole of the semiconductor layer, a second insulating layer hole of the second inorganic insulating layer, and a third insulating layer hole of the third inorganic insulating layer.

9. The display apparatus of claim 1, further comprising:

a third inorganic insulating layer located on the second inorganic insulating layer; and a first connection wiring located on the third inorganic insulating layer, wherein the lower conductive layer further comprises a second lower connection wiring, and wherein the first connection wiring is electrically connected to the second lower connection wiring through a hole of the first inorganic insulating layer, a hole of the second inorganic insulating layer, and a hole of the third inorganic insulating layer.

10. The display apparatus of claim 1, further comprising:

a second connection wiring located on the second inorganic insulating layer;

a third inorganic insulating layer located on the second connection wiring; and a connection electrode located on the third inorganic insulating layer, wherein the lower conductive layer further comprises a third lower connection wiring, wherein the connection electrode is electrically connected to the third lower connection wiring through a hole of the first inorganic insulating layer, a hole of the second inorganic insulating layer, and a first hole of the third inorganic insulating layer, and the second connection wiring is electrically connected to the connection electrode through a second hole of the third inorganic insulating layer.

11. The display apparatus of claim 1, further comprising:

a first conductive layer located on the second inorganic insulating layer, and comprising a gate electrode overlapping with the semiconductor layer;

a third inorganic insulating layer covering the gate electrode;

a second conductive layer located between the third inorganic insulating layer and the display element layer, and comprising a source electrode and a drain electrode; and an organic insulating layer located between the second conductive layer and the display element layer, wherein the display element comprises a pixel electrode directly connected to one of the source electrode or the drain electrode through a contact hole of the organic insulating layer.

12. The display apparatus of claim 11, wherein the second conductive layer comprises aluminum.

13. The display apparatus of claim 1, further comprising a fourth inorganic insulating layer covering at least a part of the pad electrode, and comprising an upper pad hole overlapping with the pad electrode.

14. The display apparatus of claim 1, further comprising:

a second substrate located on the display element layer; and a sealing member located between the first substrate and the second substrate, and surrounding around a periphery of the display area, wherein the sealing member at least partially overlaps with the lower conductive layer in a plan view.

15. The display apparatus of claim 1, wherein the first substrate comprises glass.

* * * * *